US012601796B2

(12) United States Patent
Mizuochi et al.

(10) Patent No.: US 12,601,796 B2
(45) Date of Patent: Apr. 14, 2026

(54) PHASE DIFFERENCE MEASUREMENT DEVICE, MEASUREMENT METHOD, AND ELECTRICAL EQUIPMENT COMPRISING SAME

(71) Applicants: Kyoto University, Kyoto (JP); NISSIN ELECTRIC CO., LTD., Kyoto (JP)

(72) Inventors: Norikazu Mizuochi, Kyoto (JP); Ernst David Herbschleb, Kyoto (JP); Hiroki Morishita, Kyoto (JP); Hiroya Saito, Kyoto (JP); Hiroshige Deguchi, Kyoto (JP); Natsuo Tatsumi, Kyoto (JP); Tsukasa Hayashi, Kyoto (JP)

(73) Assignees: Kyoto University, Kyoto (JP); NISSIN ELECTRIC CO., LTD., Kyoto (JP)

( * ) Notice: Subject to any disclaimer, the term of this patent is extended or adjusted under 35 U.S.C. 154(b) by 187 days.

(21) Appl. No.: 18/580,616

(22) PCT Filed: Oct. 26, 2022

(86) PCT No.: PCT/JP2022/039967
§ 371 (c)(1),
(2) Date: Jan. 19, 2024

(87) PCT Pub. No.: WO2023/074750
PCT Pub. Date: May 4, 2023

(65) Prior Publication Data
US 2024/0377485 A1 Nov. 14, 2024

(30) Foreign Application Priority Data
Oct. 29, 2021 (JP) ................................. 2021-177921

(51) Int. Cl.
*G01R 33/12* (2006.01)
*G01R 33/032* (2006.01)
*G01R 33/26* (2006.01)

(52) U.S. Cl.
CPC ....... *G01R 33/1284* (2013.01); *G01R 33/032* (2013.01); *G01R 33/26* (2013.01)

(58) Field of Classification Search
CPC .. G01R 33/1284; G01R 33/323; G01R 33/60; G01R 33/032; G01R 33/26; G01R 21/00; G01R 21/08; G01R 25/00; G01N 24/10
(Continued)

(56) References Cited

U.S. PATENT DOCUMENTS

| | | | | |
|---|---|---|---|---|
| 8,120,355 B1 * | 2/2012 | Stetson | .............. | G01R 33/1284 |
| | | | | 324/76.21 |
| 8,311,767 B1 * | 11/2012 | Stetson | .................. | G01C 17/00 |
| | | | | 702/152 |

(Continued)

FOREIGN PATENT DOCUMENTS

| | | |
|---|---|---|
| JP | 2012103171 | 5/2012 |
| JP | 2012105488 | 5/2012 |

(Continued)

OTHER PUBLICATIONS

Michl, Julia, et al. "Robust and accurate electric field sensing with solid state spin ensembles." Nano letters 19.8 (2019): 4904-4910. (Year: 2019).*

(Continued)

*Primary Examiner* — Christopher P McAndrew
(74) *Attorney, Agent, or Firm* — JCIPRNET

(57) ABSTRACT

The present invention measures, with high sensitivity, the phase difference between a plurality of physical fields. A phase difference measurement device (10) comprises: an electromagnetic irradiation unit (2) that repeatedly irradiates a quantum sensor element (1) with electromagnetic waves for manipulating an electron spin state of the quantum sensor element (1) which changes via interaction with a second physical field or a first physical field generated by an (Continued)

9(9a)

10

AC signal; and a phase difference measurement unit (3) that acquires a plurality of electron spin states after interaction with the second physical field or the first physical field, and measures the phase difference between a plurality of physical fields on the basis of the acquired plurality of electron spin states.

11 Claims, 21 Drawing Sheets

(58) Field of Classification Search
  USPC ........................................................ 324/96
  See application file for complete search history.

(56) References Cited

U.S. PATENT DOCUMENTS

| | | | | |
|---|---|---|---|---|
| 9,551,763 | B1 * | 1/2017 | Hahn | G01R 33/032 |
| 10,564,231 | B1 * | 2/2020 | Mandeville | G01R 33/26 |
| 10,948,557 | B2 * | 3/2021 | Darnell | H02J 50/27 |
| 2001/0040446 | A1 | 11/2001 | Lapinksi et al. | |
| 2002/0101231 | A1 | 8/2002 | Staats | |
| 2014/0343878 | A1 | 11/2014 | Gudmundsson et al. | |
| 2017/0370979 | A1 | 12/2017 | Braje et al. | |
| 2019/0018086 | A1 * | 1/2019 | Manickam | G01R 33/26 |
| 2019/0277842 | A1 * | 9/2019 | Cleveland | G01R 33/323 |
| 2020/0049776 | A1 * | 2/2020 | Wood | G01R 33/307 |
| 2020/0064419 | A1 * | 2/2020 | Barry | G01R 33/323 |
| 2020/0088812 | A1 * | 3/2020 | Manickam | G01R 33/0029 |
| 2020/0284862 | A1 * | 9/2020 | Lukin | G01R 33/1284 |
| 2023/0176154 | A1 * | 6/2023 | Brenneis | G01R 33/0206 |
| | | | | 324/301 |

FOREIGN PATENT DOCUMENTS

| | | |
|---|---|---|
| JP | 2017075964 | 4/2017 |
| JP | 2018136316 | 8/2018 |

OTHER PUBLICATIONS

"International Search Report (Form PCT/ISA/210) of PCT/JP2022/039967", mailed on Dec. 27, 2022, with English translation thereof, pp. 1-6.

F. Dolde et al., "Electric-field sensing using single diamond spins", Nature Physics, vol. 7, Apr. 2011, pp. 459-463.

Hibiki Tabuchi et al., "Temperature Sensing with RF-Dressed States of Nitrogen-Vacancy Centers in Diamond", arXiv:2205.06976v1, May 2022, pp. 1-5.

\* cited by examiner

9(9a)

10

PHASE DIFFERENCE MEASUREMENT DEVICE, MEASUREMENT METHOD, AND ELECTRICAL EQUIPMENT COMPRISING SAME

CROSS-REFERENCE TO RELATED APPLICATION

This application is a 371 application of the International PCT application serial no. PCT/JP2022/039967, filed on Oct. 26, 2022, which claims the priority benefits of Japan Patent Application No. 2021-177921, filed on Oct. 29, 2021. The entirety of each of the above-mentioned patent applications is hereby incorporated by reference herein and made a part of this specification.

TECHNICAL FIELD

The present invention relates to a technique using a quantum sensor, and more particularly to a device and a method for measuring a phase difference between a magnetic field and an electric field using a quantum sensor, and electrical equipment equipped with a phase difference measurement device.

RELATED ART

When an alternating current is supplied through an electric line in a power system, reactive power flows through the electric line. As reactive power increases, power loss increases. A device that adjusts the power factor is connected to the power system, which is highly effective in improving the stability of the power system and suppressing power fluctuations. For example, Patent Literature 1 discloses a system for adjusting reactive power of a distribution line.

Devices that adjust the power factor are referred to as phase adjustment equipment. Phase adjustment equipment includes a power capacitor, a shunt reactor, a synchronous phase adjustment machine, a static VAR compensator (SVC), and the like. When adjusting and improving the power factor of a power system using phase adjustment equipment, the reactive power flowing through the power system is measured. Reactive power is expressed using an effective value of a voltage, an effective value of a current, and a phase difference between a voltage and a current.

Large currents and high voltages flow through power lines. For example, at ultra-high voltage substations, high voltages of hundreds of thousands of volts flow through power transmission lines, and at power distribution substations, high voltages ranging from several thousand volts to tens of thousands of volts flow through power distribution lines. In order to measure large currents and high voltages flowing through electrical lines, substations are provided with transformers such as current transformers and transformers in addition to phase adjustment equipment. Until now, regarding alternating currents flowing through power lines, in non-insulating transformers connected to power transmission lines and distribution lines (or in circuits surrounding the transformers), the phase difference between the phase of the voltage and the phase of the current is measured by measuring the phase of the voltage and the phase of the current, respectively. Phase adjustment equipment adjusts the power factor of the power system based on the measured phase difference.

Furthermore, in recent years, diamond has attracted attention as a material for sensor elements that measure magnetic fields. Complex defects referred to as nitrogen vacancy centers are sometimes found in the crystal structure of diamond. The nitrogen vacancy center consists of a pair of a nitrogen atom that replaces a carbon atom in the crystal lattice and a vacancy that is located adjacent to the nitrogen atom (without a carbon atom), and is also referred to as an NV center. In addition to the NV centers, in the crystal structure of diamond, complex defects referred to as silicon vacancy centers and complex defects referred to as germanium vacancy centers may be found, these complex defects containing the NV centers are referred to as color centers.

The NV center exhibits a magnetic property referred to as an electron spin in a state in which electrons are captured in vacancies (a negatively charged state, hereinafter referred to as "NV$^-$"). The NV$^-$ exhibits longer transverse relaxation time (decoherence time, hereinafter referred to as "T$_2$") compared to a state in which no electrons are captured (neutral state, hereinafter referred to as "NV$^0$"). In other words, in the electron spin state of the NV$^-$, after the magnetization of the electron spins aligned in the vertical direction of the external magnetic field (hereinafter referred to as the "quantization axis") is tilted in the horizontal direction, individual orientations of individual spins shift due to the precession of the individual spins, and the time for the transverse magnetization as a whole to disappear is long. Furthermore, the NV$^-$ exhibits a long T$_2$ value even at room temperature (approximately 300 K).

The electron spin state of the NV$^-$ changes in response to an external magnetic field, and the electron spin state can be measured at room temperature, so diamond containing NV centers can be used as a material for magnetic field sensor elements.

For example, Patent Literature 2 discloses a method for measuring an alternating current magnetic field using magnetic resonance caused by electron spins in diamond. A pulse sequence based on the spin echo method is given to the spin.

For example, in Patent Literature 3, a method for measuring alternating magnetic fields using the optically detected magnetic resonance (ODMR) method for electron spins in diamond is disclosed. The NV center is excited by laser light, and a magnetic resonance signal (phase information) related to the spin state is detected by measuring changes in fluorescence intensity emitted from the NV center.

In addition to sensors using diamond color centers, there are various types of sensors used as magnetic field sensor elements, for example, sensors using color centers in silicon carbide (SiC), optically pumped atomic magnetometers (OPMs), superconducting quantum interference devices (SQUIDs) and the like. These diamond color centers, color centers in silicon carbide, optically pumped atomic magnetometers, and superconducting quantum interference devices are referred to as quantum sensors because of measuring physical quantities using quantum effects.

CITATION LIST

Patent Literature

Patent Literature 1: Japanese Patent Application Laid-Open No. 2012-105488
Patent Literature 2: Japanese Patent Application Laid-Open No. 2012-103171
Patent Literature 3: Japanese Patent Application Laid-Open No. 2017-75964

SUMMARY OF INVENTION

Technical Problem

When trying to measure the phase difference between a voltage and a current in a non-insulating transformer (or in a circuit around the transformer) for an alternating current on a power line where a large current and a high voltage are flowing, the transformer requires a protection circuit to protect the circuit from the large current and the high voltage. As a result, electrical equipment including power transmission and substation equipment such as transformers and switches and electric lines becomes larger and more expensive. In recent years, various types of equipment have been installed to connect direct current (DC) power from, for example, solar power generation facilities to power grids, and the scale of electrical equipment has also increased. There is a need to measure the phase difference between a voltage and a current of an alternating current flowing through electrical equipment without requiring a protection circuit.

Furthermore, when signs of failure appear in the electrical equipment itself due to aging. a phase difference occurs between a minute electric field and a minute magnetic field generated by fluctuations in the alternating current flowing through the electrical equipment. In order to quickly detect signs of failure in the electrical equipment, it is needed to measure the phase difference between the magnetic field and the electric field with high sensitivity.

The present invention is intended to measure a phase difference between multiple physical fields with high sensitivity.

Solution to Problem

The present invention for solving the above problems includes, for example, the following aspects.
(Aspect 1)
A phase difference measurement device includes: an electromagnetic irradiation unit that repeatedly irradiates a quantum sensor element with electromagnetic waves for manipulating an electron spin state of the quantum sensor element which changes via interaction with a first physical field or a second physical field generated by an alternating current (AC) signal; and a phase difference measurement unit that acquires multiple electron spin states after interaction with the first physical field or the second physical field, and measures a phase difference between multiple physical fields based on the electron spin states acquired.
(Aspect 2)
The phase difference measurement device according to Aspect 1, in which the phase difference measurement unit further includes: a first physical field phase calculation unit that calculates a phase of the first physical field based on the electron spin states after interaction with the first physical field; and a second physical field phase calculation unit that calculates a phase of the second physical field based on the electron spin states after interaction with the second physical field, and the phase difference measurement unit measures the phase difference based on the phase of the first physical field calculated and the phase of the second physical field calculated.
(Aspect 3)
The phase difference measurement device according to Aspect 2, in which the first physical field phase calculation unit calculates the phase of the first physical field by fitting multiple time-series data corresponding to the electron spin states after interaction with the first physical field, and the second physical field phase calculation unit calculates the phase of the second physical field by fitting multiple time-series data corresponding to the electron spin states after interaction with the second physical field.
(Aspect 4)
The phase difference measurement device according to any one of Aspects 1 to 3, in which the electromagnetic irradiation unit is a pulse sequence for observing a free induction decay (FID) signal of the electron spin state, and repeatedly irradiates the quantum sensor element with the electromagnetic waves in a pulse sequence including multiple $\pi/2$ pulses.
(Aspect 5)
The phase difference measurement device according to Aspect 3, in which the electromagnetic irradiation unit is a pulse sequence for observing a spin echo signal of the electron spin state, and repeatedly irradiates the quantum sensor element with the electromagnetic waves in a pulse sequence including multiple $\pi/2$ pulses and $\pi$ pulses between the $\pi/2$ pulses, and each of the first physical field phase calculation unit and the second physical field phase calculation unit fits the time-series data corresponding to curvature of the AC signal.
(Aspect 6)
The phase difference measurement device according to any one of Aspects 1 to 5, in which the phase difference measurement unit further includes: a light irradiation unit that irradiates the quantum sensor element with light for reading phase information of the electron spin state after interaction with the first physical field or the second physical field; a change detection unit that detects a change that occurs in the quantum sensor element due to irradiation of the light; and a data processing unit that reads phase information of the electron spin state from the change detected and measures the phase difference between the phase of the first physical field and the phase of the second physical field based on the phase information of the electron spin state that is read.
(Aspect 7)
The phase difference measurement device according to Aspect 6 further includes a pulse pattern generator that outputs a pulse signal for operation timing to the electromagnetic irradiation unit and the light irradiation unit using a fluorescence intensity when initializing the electron spin state as a trigger, and corrects a deviation in a measurement cycle.
(Aspect 8)
The phase difference measurement device according to Aspect 7, in which the pulse signal for operation timing is connected in series between multiple phase difference measurement devices.
(Aspect 9)
The phase difference measurement device according to any one of Aspects 1 to 8, in which the AC signal is an AC signal passing through electrical equipment.
(Aspect 10)
A phase difference measurement method includes: a quantum sensor element is repeatedly irradiated with electromagnetic waves for manipulating an electron spin state of the quantum sensor element which changes via interaction with a first physical field or a second physical field generated by an alternating current (AC) signal; and multiple electron spin states after interaction with the first physical field or the second physical field are acquired, and a phase difference between a phase of the first physical field and a phase of the second physical field is measured based on the electron spin states acquired.

(Aspect 11)

The phase difference measurement method according to Aspect 10, in which measuring the phase difference includes: the phase of the first physical field is calculated based on the electron spin states after interaction with the first physical field; the phase of the second physical field is calculated based on the electron spin states after interaction with the second physical field; and the phase difference is measured based on the phase of the first physical field calculated and the phase of the second physical field calculated.

(Aspect 12)

The phase difference measurement method according to Aspect 11, in which when calculating the phase of the first physical field, the phase of the first physical field is calculated by fitting multiple time-series data corresponding to the electron spin states after interaction with the first physical field, and when calculating the phase of the second physical field, the phase of the second physical field is calculated by fitting time-series data corresponding to the electron spin states after interaction with the second physical field.

(Aspect 13)

Electrical equipment includes the phase difference measurement device according to any one of Aspects 1 to 9.

Effects of Invention

The present invention may measure, with high sensitivity, the phase difference between multiple physical fields, such as magnetic fields and electric fields generated around electrical equipment through which an alternating current flows.

DESCRIPTION OF EMBODIMENTS

Figure 1:
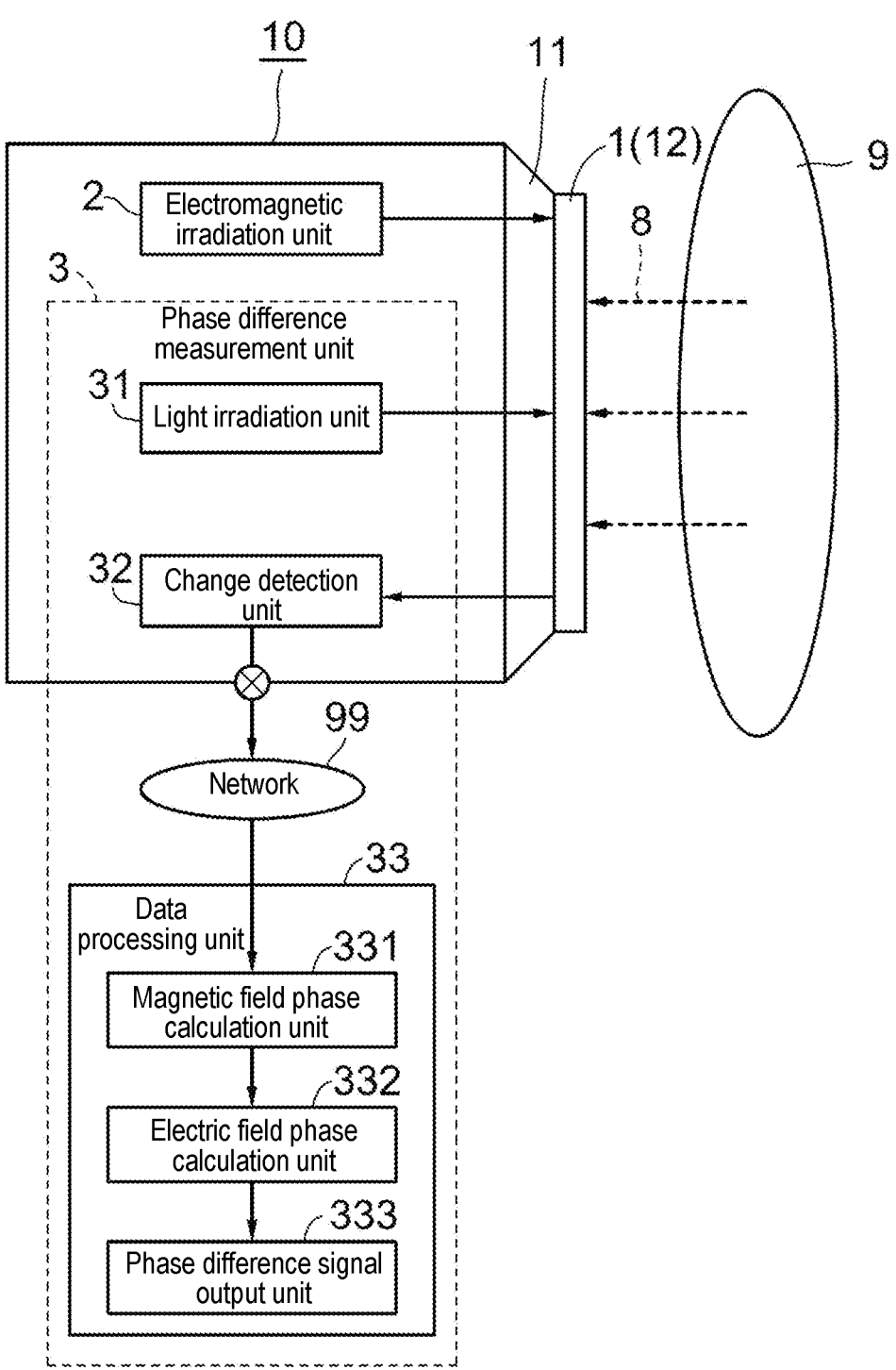
FIG. 1 is a diagram schematically showing a schematic configuration of a phase difference measurement device 10 according to an embodiment of the present invention.

Embodiments of the present invention will be described in detail below with reference to the accompanying drawings. Note that in the following description and drawings, the same reference numerals indicate the same or similar components, and therefore, redundant description of the same or similar components will be omitted.

In addition, in the description, a physical quantity is defined as a dimension under a certain system in physics, and a quantity that can be expressed as a multiple of a given physical unit. Examples of physical quantities include, for example, magnetic fields, electric fields, temperature, and mechanical quantities (mechanical stress, pressure, etc.). The magnetic fields, electric fields, and mechanical quantities include physical quantities that do not change over time and physical quantities that repeatedly change direction over time. That is, the magnetic field includes a static magnetic field and an alternating magnetic field, the electric field includes a static electric field and an alternating electric field, and the mechanical quantity includes a static mechanical quantity and an alternating mechanical quantity.

In an embodiment of the present invention described below, the magnetic field and the electric field are respectively a first physical field and a second physical field, and for an alternating current flowing through electrical equipment, a case will be described in which a phase difference between a phase of a voltage and a phase of a current is measured. Illustratively, the frequency of the alternating current is about 50 Hz to about 60 Hz.

<Relationships Between Phase Of Magnetic Field and Phase of Electric Field and Between Phase of Voltage and Phase of Current>

The relationship between a phase of a magnetic field and a phase of an electric field generated around electrical equipment 9 and a phase of a voltage and a phase of a current related to an alternating current flowing through the electrical equipment 9 will be described. Regarding the magnetic field and the electric field generated around the electrical equipment 9 through which the alternating current flows, the phase of the magnetic field has a correlation with the phase of the alternating current, and the phase of the electric field has a correlation with the phase of the alternating current voltage.

The phase of the current is measured by measuring the phase of the magnetic field generated by the current flowing. The phase of the magnetic field is calculated from the first term of a spin Hamiltonian of an electron spin, which will be described later, due to the Zeeman effect, which functions as a magnetic field sensor. The magnetic field strength is calculated from the first term, and the phase of the magnetic field is calculated from the temporal fluctuations of the calculated magnetic field strengths.

The phase of the voltage is measured by measuring a magnetic resonance signal in which the magnetic field does not contribute to the signal intensity but the electric field contributes to the signal intensity when a sensor element 1 has zero magnetic field splitting. The phase of the electric field is calculated from the third term of a spin Hamiltonian of an electron spin, which will be described later, which functions as an electric field sensor. The electric field strength is calculated from the third term, and the phase of the electric field is calculated from the temporal fluctuations of the calculated electric field strengths. Note that when measuring the phase of the voltage (the phase of the electric field), the zero point of the phase is adjusted in advance. For example, since the time rate of change of the voltage is maximum at the zero crossing point of the voltage strength, this point is used as the zero point reference.

As will be described later with reference to FIG. 5, when a magnetic field is applied to the sensor element 1, the quantum states of the sensor element 1 are separated in proportion to the strength of the applied magnetic field due to the Zeeman effect. On the other hand, when no magnetic field is applied to the sensor element 1, the first term due to the Zeeman effect of a spin Hamiltonian of an electron spin, which will be described later, does not contribute to the magnetic resonance signal. The third term (and the second term), which functions as an electric field sensor, contributes to the magnetic resonance signal when the sensor element 1 undergoes zero magnetic field splitting.

[Device Configuration]

Figure 2:
FIG. 2 is a diagram schematically showing an example of a specific configuration of the phase difference measurement device 10 shown in FIG. 1.

FIG. 1 is a diagram schematically showing a schematic configuration of a phase difference measurement device 10 according to an embodiment of the present invention. FIG. 2 is a diagram schematically showing an example of a specific configuration of the phase difference measurement device 10 shown in FIG. 1.

The phase difference measurement device 10 (hereinafter simply referred to as the measurement device 10) includes the sensor element 1, an electromagnetic irradiation unit 2, and a phase difference measurement unit 3. In the embodiment, the sensor element 1 is attached to the tip of a probe 11 of the measurement device 10.

The sensor element 1 is a quantum sensor element. In the embodiment, the sensor element 1 is a diamond crystal having a color center, and the NV center is used as the color center.

The NV center is a complex (complex defect) of nitrogen (N) replacing a carbon atom and a vacancy (V) adjacent to the nitrogen. In the embodiment, the sensor element 1 is previously produced within a predetermined region on a diamond crystal 12 by a known method. For example, multiple sensor elements 1 on the order of several thousand (concentration: ~$1 \times 10^{12}/cm^{-3}$) are generated within the region. In the embodiment, the sensor element 1 is the center of the ensemble NV.

An electron spin state of the sensor element 1 is changed by interaction 8 with an object 9. In the embodiment, the object 9 is electrical equipment, and the interaction 8 is interaction due to a magnetic field and an electric field. Due to the interaction 8 with the object 9, the electron spin state of the color center of the sensor element 1 becomes a state corresponding to the strength of the magnetic field and the strength of the electric field generated around the electrical equipment which is the object 9.

The electromagnetic irradiation unit 2 irradiates the sensor element 1 with electromagnetic waves for manipulating the electron spin state of the sensor element 1 by magnetic resonance. As an example, in the embodiment, the electromagnetic irradiation unit 2 includes a known microwave (MW) oscillator 21 and a switch 22 which irradiates electromagnetic waves in a pulsed form and an amplifier 23. The switch 22 and the amplifier 23 may have any configuration. In the embodiment, the electromagnetic irradiation unit 2 irradiates the sensor element 1 with electromagnetic waves in a pulsed form for manipulating the electron spin state of the sensor element 1.

As a pulse sequence of the electromagnetic waves that the electromagnetic irradiation unit 2 irradiates to the sensor element 1, various pulse sequences for causing magnetic resonance can be used.

Illustratively, in the embodiment, a pulse sequence is used to observe a free induction decay (FID) signal as a magnetic resonance signal. A pulse sequence for observing such a free induction decay (FID) signal is exemplified as an example of a pulse sequence used when detecting a magnetic resonance signal, and is a simpler pulse sequence than a pulse sequence based on the Hahn echo method or the Ramsey method. Illustratively, other embodiments may use a pulse sequence that observes a spin echo signal as a magnetic resonance signal.

The electromagnetic irradiation unit 2 irradiates the sensor element 1 with electromagnetic waves through an antenna 14 for electromagnetic wave irradiation disposed near the sensor element 1. The antenna 14 is formed on the diamond crystal 12 using a conductive metal, for example, by lithography technology.

The phase difference measurement unit 3 calculates, based on the change in the electron spin states of the sensor element 1 after the change due to the interaction 8 with the object 9, the phase of the magnetic field and the phase of the electric field separately, and measures the phase difference between the phase of the magnetic field and the phase of the electric field. Both the phase of the magnetic field and the phase of the electric field are calculated by fitting time-series data of magnetic resonance signals. In the embodiment, the phase of the magnetic field and the phase of the electric field are calculated by fitting time-series data of multiple free induction decay (FID) signals. The phase difference measurement unit 3 includes a light irradiation unit 31, a change detection unit 32 and a data processing unit 33.

The light irradiation unit 31 irradiates the sensor element 1 with light for reading phase information of the electron spin state of the sensor element 1 after interaction with the object 9. Further, the light irradiation unit 31 irradiates the sensor element 1 with light for initializing the electron spin state of the sensor element 1. As an example, in the embodiment, the light irradiation unit 31 includes a light source 311, an acoustic optical modulator (AOM) 312 and an objective lens 313. The acoustic optical modulator 312 and the objective lens 313 may have any configuration.

The light source 311 emits light for reading phase information of the electron spin state of the sensor element 1 after interaction with the object 9. Further, the light source 311 emits light for exciting and initializing the electron spin state of the sensor element 1. The wavelength of the light emitted by the light source 311 is determined depending on the type of the sensor element 1. In the embodiment, the light source 311 emits laser light with a wavelength of 532 nm (green). For example, various known laser generators can be used as the light source 311. In the embodiment, the light source 311 is a semiconductor laser that emits green laser light.

The objective lens 313 condenses the light emitted from the light source 311 and irradiates the condensed light onto the region on the diamond crystal 12 where the sensor element 1 is formed. Illustratively, a spot size of the laser light condensed on the diamond crystal 12 has a diameter of about 2 μm. As the spot size of the laser light decreases, the strength of the laser light per unit area increases and the efficiency of the photocurrent generated in a diamond conductive band also increases.

In the configuration illustrated in FIG. 2, a spot of the laser light is disposed so as to cover the region on the diamond crystal 12 where the sensor element 1 is generated. Exemplarily, the spot of the laser light can be disposed at a position offset from approximately the center of the region where the sensor element 1 is generated.

The change detection unit 32 detects a change occurring in the sensor element 1. In the embodiment, the change detection unit 32 detects a magnetic resonance signal as a change in emission intensity by detecting the light emitted from the sensor element 1 using a known optically detected magnetic resonance (ODMR) method. In this case, for example, a known photodiode can be used as the change detection unit 32. For example, an avalanche photodiode can be used as the photodiode.

In the embodiment, the electromagnetic irradiation unit 2 irradiates the electromagnetic waves for operation in a pulsed form. Therefore, in the embodiment, specifically, detection is performed using the pulsed optically detected magnetic resonance (pODMR) method.

The data processing unit 33 is connected to the change detection unit 32, reads phase information of the electron spin state of the sensor element 1 after interaction with the object 9 from the change detected by the change detection unit 32, and measures the phase difference between the phase of the magnetic field and the phase of the electric field based on the read phase information. The data processing unit 33 includes a magnetic field phase calculation unit 331, an electric field phase calculation unit 332 and a phase difference signal output unit 333.

For the data processing unit 33, for example, a known general-purpose computer or various information terminal devices such as a smartphone can be used. The data processing unit 33 may be configured to be integrated with the measurement device 10, or alternatively, as illustrated, may be provided outside the measurement device 10 and connected to the measurement device 10 via a wired or wireless network 99.

The magnetic field phase calculation unit 331 calculates the phase of the magnetic field based on multiple electron spin states after interaction with the magnetic field. The observed magnetic resonance signal reflects the electron spin state, and the phase of the magnetic field is calculated by fitting time-series data of multiple magnetic resonance signals after interaction with the magnetic field.

The electric field phase calculation unit 332 calculates the phase of the electric field based on multiple electron spin states after interaction with the electric field. The observed magnetic resonance signal reflects the electron spin state, and the phase of the electric field is calculated by fitting time series data of multiple magnetic resonance signals after interaction with the electric field.

In the embodiment, the magnetic field phase calculation unit 331 and the electric field phase calculation unit 332 each calculate the phase of the magnetic field and the phase of the electric field, respectively by fitting time-series data of the free induction decay (FID) signals.

The phase difference signal output unit 333 outputs a signal containing information regarding the phase difference between the phase of the magnetic field and the phase of the electric field. The phase difference signal is transmitted, for example, via the network 99, to an unillustrated computer device that centrally manages the operating status of other electrical equipment. After that, for example, a computer device for central management determines whether or not power factor adjustment is needed based on the received phase difference signal, and transmits information regarding power factor adjustment together with the phase difference signal to unillustrated phase adjustment equipment. The phase adjustment equipment adjusts the power factor of the power system based on the received phase difference signal and the information regarding power factor adjustment. Alternatively, the phase difference signal is directly transmitted to the unillustrated phase adjustment equipment via the network 99, for example, and the phase adjustment equipment adjusts the power factor of the power system based on the received phase difference signal.

Figure 3:
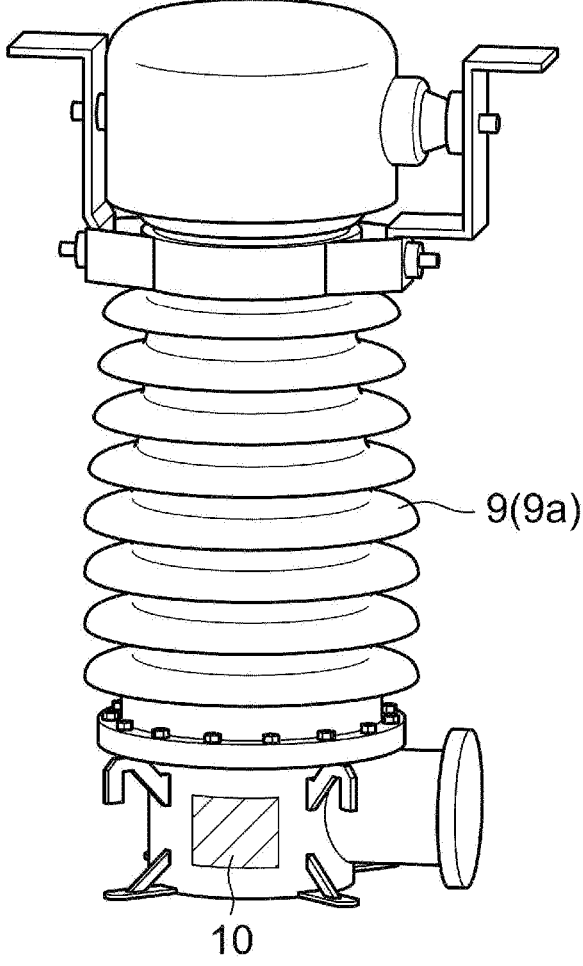
FIG. 3 is a schematic diagram of electrical equipment 9 including the phase difference measurement device 10 according to an embodiment of the present invention.
Figure 4:
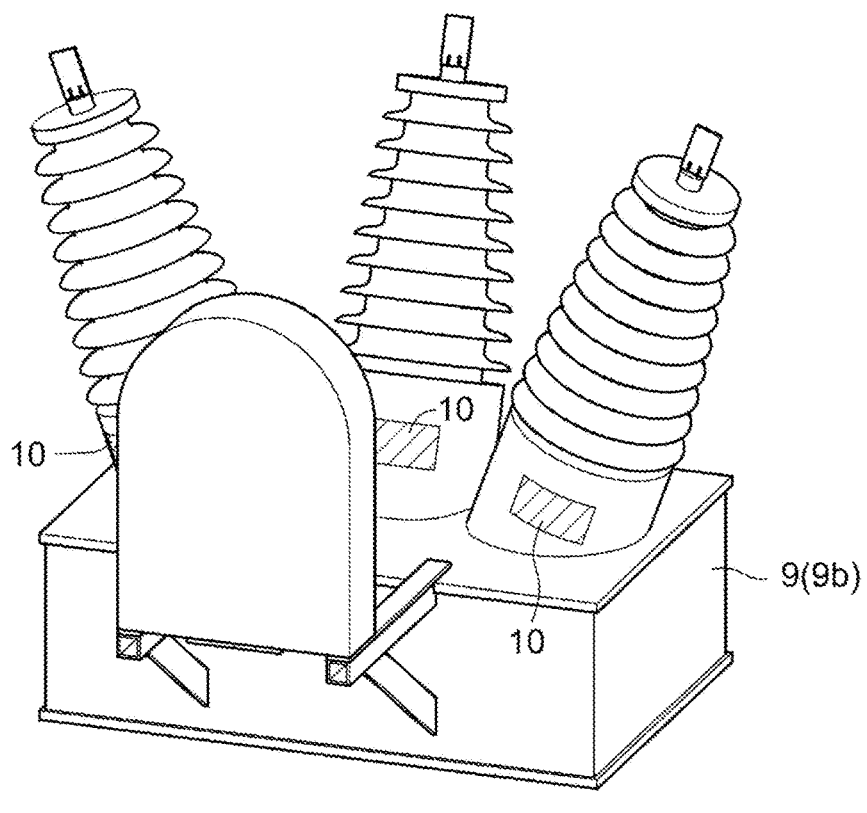
FIG. 4 is a schematic diagram of electrical equipment 9 including the phase difference measurement device 10 according to an embodiment of the present invention.

FIGS. 3 and 4 are schematic diagrams of the electrical equipment 9 including the phase difference measurement device 10 according to an embodiment of the present invention. As the electrical equipment 9, FIG. 3 illustrates a current transformer 9a, and FIG. 4 illustrates a transformer 9b. The location of the measurement device 10 illustrated in the figures is an example.

The measurement device 10 is disposed at a position where the magnetic field and the electric field generated around the electrical equipment 9 (9a, 9b) can be sensed. Exemplarily, the measurement device 10 is disposed such that a direction of an axis along which the sensor element 1 senses the magnetic field or the electric field is along a direction of the magnetic field or the electric field generated around the electrical equipment 9.

In other embodiments, multiple measurement device 10 and measurement device 10 can be disposed in one the electrical equipment 9. For example, the first measurement device 10 for measuring the phase of the voltage can be disposed at a location where the strength of the electric field is the highest in the current transformer 9a, and the second measurement device 10 for measuring the phase of the current can be disposed at the location of where the strength of the magnetic field is the highest in the current transformer 9*a*. The same applies when the electrical equipment 9 is the transformer 9*b*.

[Measurement Principle]

In the present invention, the sensor element 1 is used to measure the phase difference between the magnetic field and the electric field generated around the electrical equipment 9. The sensor element 1 is a quantum sensor element, and thus the phase difference between the voltage and the current related to the alternating current flowing through the electrical equipment 9 can be measured with high sensitivity. The magnetic resonance signals used to calculate the phase of the magnetic field and the phase of the electric field are detected by the optically detected magnetic resonance (ODMR) method. Thus, the phase difference between the voltage and the current related to the alternating current may be measured in a non-contact manner without direct electrical connection to the electrical equipment 9.

First, the principle and procedure for detecting magnetic resonance signals by the optically detected magnetic resonance (ODMR) method will be described below. Next, a method for calculating the strength of the magnetic field and the strength of the electric field from the detected magnetic resonance signals will be described. Lastly, the concept of phase difference measurement of the present invention, which measures the phase difference between the phase of the voltage and the phase of the current related to the alternating current, will be described.

<Detection of Magnetic Resonance Signals by Optically Detected Magnetic Resonance (ODMR) Method>

Figure 5:
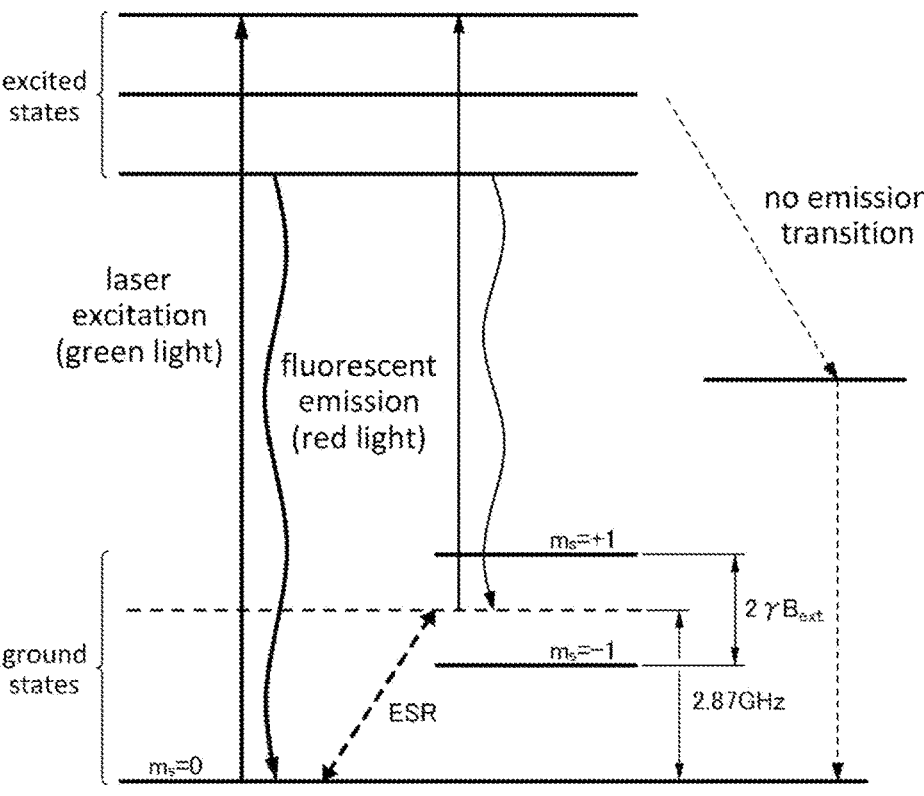
FIG. 5 is a diagram schematically showing the energy level of electrons at the NV center of diamond.

FIG. 5 is a diagram schematically showing the energy level of electrons at the $NV^-$ center of diamond.

In the embodiment, the NV center of diamond is used as the sensor element 1. A ground state of the NV center is a spin triplet state with magnetic quantum numbers $m_s=-1, 0, +1$, and in a steady state at room temperature, and all levels are equally distributed in the ground state.

When irradiated with laser light with a wavelength of 532 nm (green), an electron with a magnetic quantum number $m_s=0$ in the ground state transitions to an excited state, emits red fluorescence, and relaxes to the ground state with a magnetic quantum number $m_s=0$.

On the other hand, when irradiated with microwaves with a resonance frequency of 2.87 GHz, electron spin resonance (ESR) occurs and an electron with a magnetic quantum number $m_s=0$ in the ground state transitions to a doubly degenerate ground state with magnetic quantum number $m_s=\pm1$. When irradiated with a laser light having a wavelength of 532 nm (green), an electron with a magnetic quantum number $m_s=\pm1$ in such a ground state transitions to an excited state, and returns to the ground state with a magnetic quantum number $m_s=0$ with a certain probability. This series of processes is a non-radiative transition that does not emit fluorescence.

As described above, the process of emitting red fluorescence becomes difficult to occur when magnetic resonance occurs and the electron is in the ground state with a magnetic quantum number $m_s=\pm1$. In addition, since the doubly degenerate ground state with the magnetic quantum number $m_s=\pm1$ is separated by the Zeeman splitting in proportion to the strength of the external magnetic field, the strength of the fluorescence also changes depending on which state of the magnetic quantum number $m_s=\pm1$ the electron is in. Therefore, a magnetic resonance signal can be detected as a point where the strength of the red fluorescence decreases when the microwave frequency is swept around 2.87 GHz.

Figure 6:
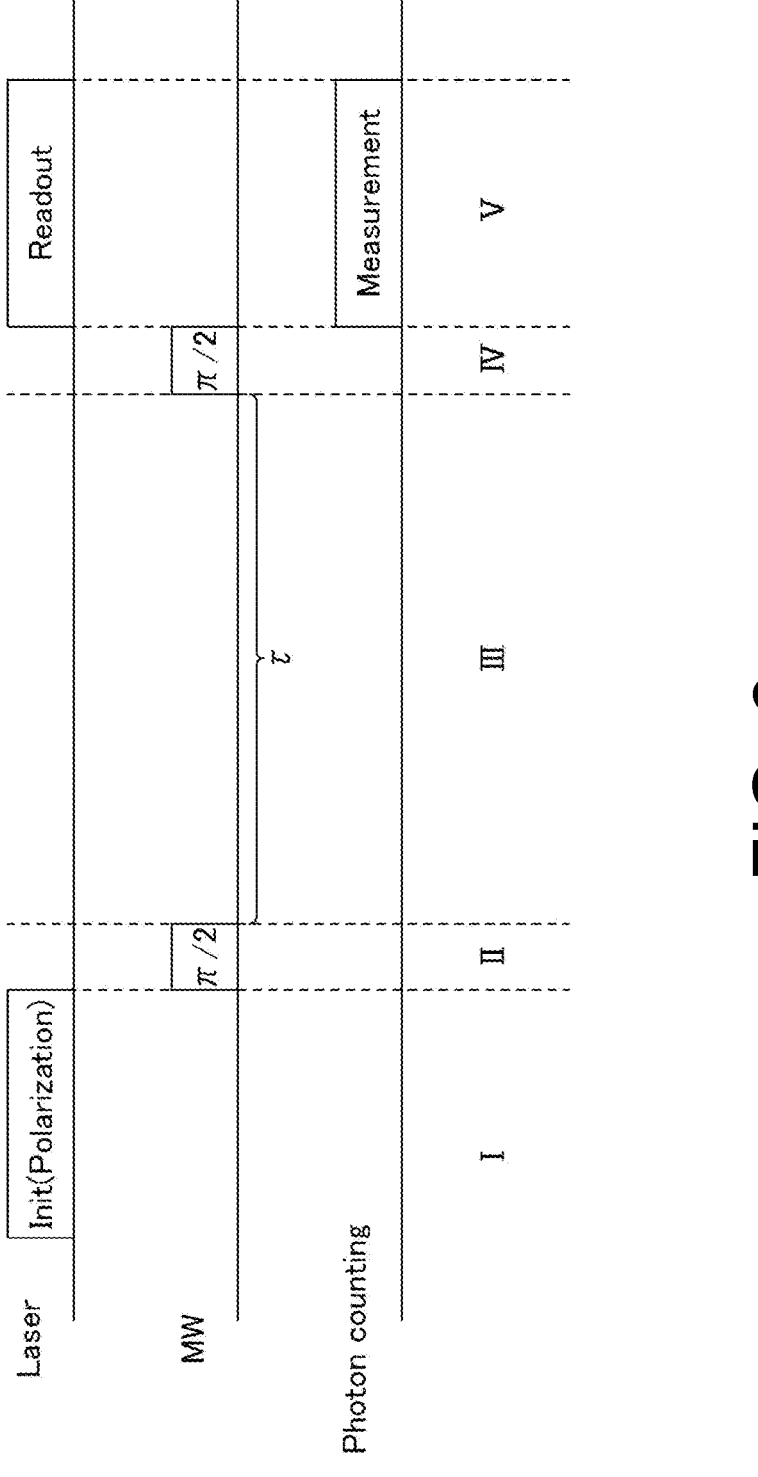
FIG. 6 is an exemplary pulse sequence when sensing a magnetic field using the optically detected magnetic resonance (ODMR) method, which is a pulse sequence for observing a free induction decay (FID) signal.

FIG. 6 is an exemplary pulse sequence when sensing a magnetic field using the optically detected magnetic resonance (ODMR) method. The pulse sequence of the electromagnetic wave for operation shown in FIG. 6 is a pulse sequence for observing a free induction decay (FID) signal using a pulse sequence including two $\pi/2$ pulses.

State I to State V of the pulse sequence shown in FIG. 6 will be described. State I represents a state in which an electron spin is initialized by irradiation of laser light. In the Bloch sphere, which is a notation method for expressing quantum states on a unit sphere, the electron spin is aligned in the direction along a z-axis, which is the quantization axis.

Next, by irradiating a $\pi/2$ pulse in State II, an operation is performed to tilt the electron spin along the quantization axis to a plane perpendicular to the quantization axis. The electron spin is thrown onto an xy plane of the Bloch sphere. After that, the electron spin which has been thrown onto the xy plane is in State III during a predetermined time $\tau$, the phase relaxes while rotating in the xy plane of the Bloch sphere due to interaction with the magnetic field. The strength of the interaction corresponds to the strength of the magnetic field felt by the electron spin. In State III, the electron spin undergoes phase relaxation while rotating in the xy plane of the Bloch sphere due to interaction with the magnetic field. Such state is observed as a free induction decay (FID) signal in the later State V.

After the predetermined time $\tau$ has elapsed while the phase is relaxed in State III, by irradiating a $\pi/2$ pulse in State IV, an operation is performed to project the phase-relaxed electron spin onto the quantization axis. The electron spin located in the xy plane of the Bloch sphere is projected onto the z-axis, which is the quantization axis, and is aligned in the direction along the z-axis.

After that, in State V, phase information of the electron spin state after interaction is read by irradiating the sensor element with laser light and detecting the light emitted from the sensor element.

In the pulse sequence including two $\pi/2$ pulses illustrated in FIG. 6, the electron spin undergoes phase relaxation while rotating in the xy plane of the Bloch sphere in State III, and in the magnetic resonance method, a signal generated when the electron spin undergoes phase relaxation in this manner is detected as a magnetic resonance signal. The time $\tau$ between the $\pi/2$ pulses corresponds to the period of State III during which the electron spin undergoes phase relaxation, and the time $\tau$ determines the sensitivity of the measurement. This is because the degree to which the electron spin undergoes phase relaxation due to interaction with the magnetic field corresponds to the strength of the magnetic field felt by the electron spin.

Similarly to the magnetic field, the electric field can also be sensed using the pulse sequence illustrated in FIG. 6.

<Method For Calculating Strength of Magnetic Field and Strength of Electric Field Based on Magnetic Resonance Signals>

In the optically detected magnetic resonance (ODMR) method, phase information (magnetic resonance signals) of the electron spin state of the sensor element 1 after interaction with the object 9 is detected as a change in emission intensity. The detected phase information is in a state corresponding to the physical quantity of the object. Therefore, the physical quantity of the object can be calculated by appropriately processing the phase information of the detected electron spin state after interaction. The physical quantity of the object can be calculated based on the Hamiltonian of the electron spin.

The Hamiltonian $H_{gs}$ of the electron spin is expressed by the following formula.

$$H_{gs} \cong \mu_B g_e S \cdot B + h D_{gs} \left[ S_z^2 - \frac{1}{3} S(S+1) \right] - \qquad \text{[Formula 1]}$$
$$d_{gs}^{\perp} \left[ E_x (S_x S_y + S_y S_x) + E_y (S_x^2 - S_y^2) \right]$$

Here, $\mu_B$ is a Bohr magneton, $g_e$ is a g-factor of the electron, and h is a Planck's constant. Vector S is the electron spin. Vector B is an applied magnetic field. $D_{gs}$ is a zero field splitting constant. $S_x$, $S_y$ and $S_z$ are an x direction component, a y direction component and a z direction component of the electron spin S, respectively. $d_{gs}^{\perp}$ is an electric dipole moment. $E_x$ and $E_y$ are an x direction component and a y direction component of an electric field, respectively.

First Term $$\mu_B g_e S \cdot B \qquad \text{[Formula 2]}$$

is a term due to the Zeeman effect, which means that the electron spin functions as a magnetic field sensor.

The second term and the third term are terms due to dipole interaction (i.e., spin-spin interaction). Second term $$h D_{gs} \left[ S_z^2 - \frac{1}{3} S(S+1) \right] \qquad \text{[Formula 3]}$$

means that the electron spin functions as a temperature sensor and a mechanical quantity (pressure) sensor. Third term $$-d_{gs}^{\perp} \left[ E_x (S_x S_y + S_y S_x) + E_y (S_x^2 - S_y^2) \right] \qquad \text{[Formula 4]}$$

means that the electron spin functions as an electric field sensor.

Therefore, the strength of the magnetic field can be calculated based on the first term. The temperature and the strength of the mechanical quantity can be calculated based on the second term. The strength of the electric field can be calculated based on the third term.

Although the present invention does not need the absolute values of the strength of the magnetic and the strength of the electric field, the magnitude of the magnetic resonance signal after interaction with the magnetic field can be calculated based on the first term of the Hamiltonian $H_{gs}$ of the electron spin, and the magnitude of the magnetic resonance signal after interaction with the electric field can be calculated based on the third term. In this way, the magnetic resonance signal after interaction with the magnetic field and the electric field can be divided into a component due to the interaction with the magnetic field and a component due to the interaction with the electric field.

<Concept of Phase Difference Measurement>

Figure 7:
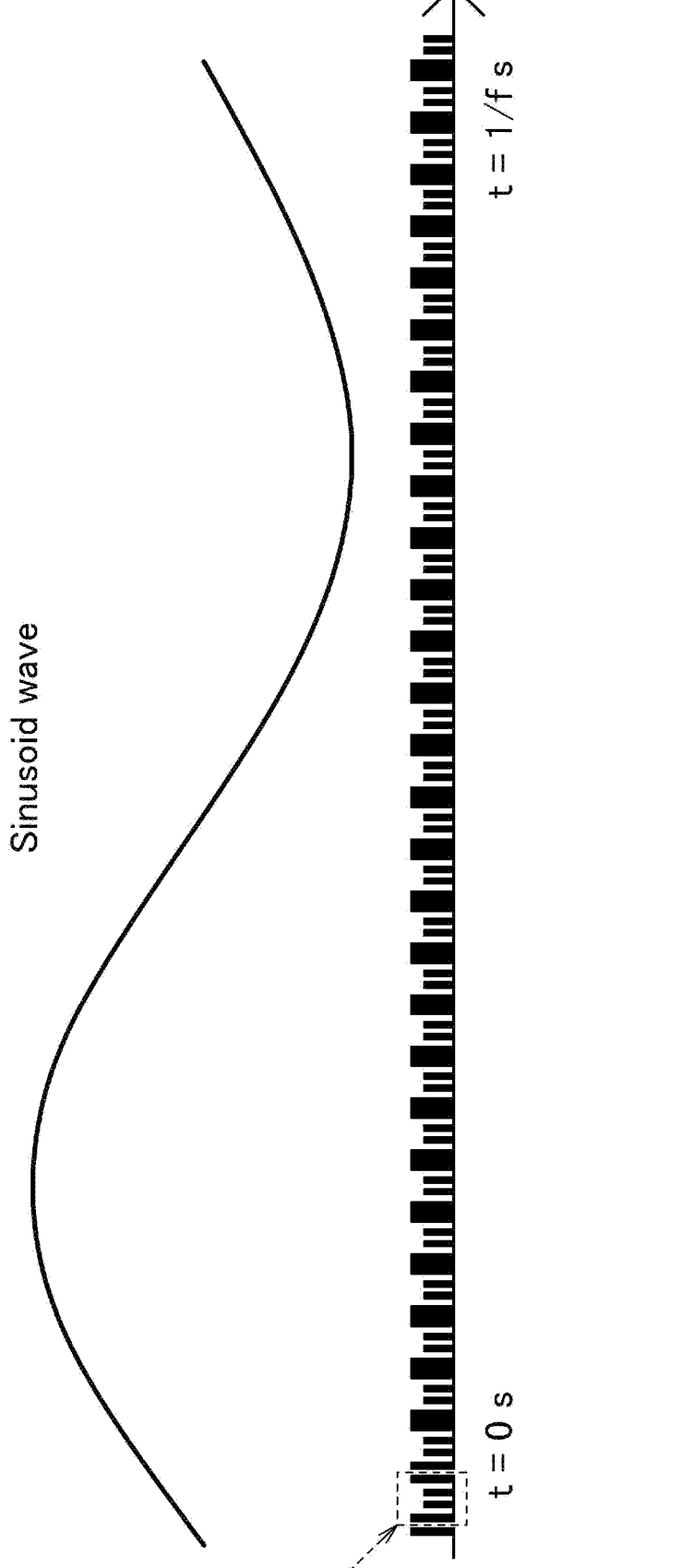
FIG. 7 is a diagram for describing an aspect of the concept of phase difference measurement of the present invention.
Figure 8:
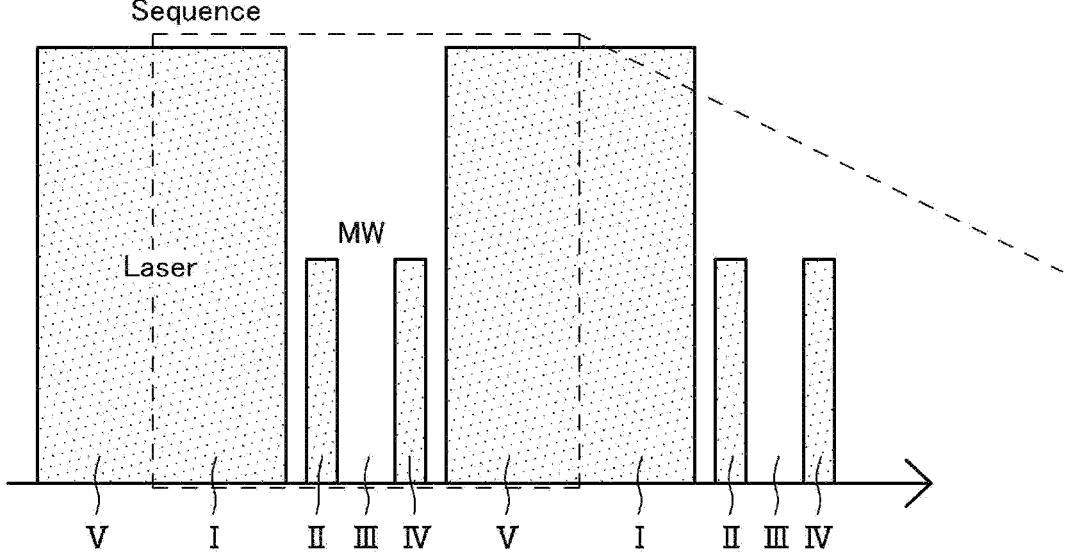
FIG. 8 is a diagram for describing an aspect of the concept of phase difference measurement of the present invention.

FIGS. 7 and 8 are diagrams for describing the concept of phase difference measurement of the present invention.

In FIG. 7, the upper part shows temporal fluctuations of the alternating current flowing through the electrical equipment, which is the object 9, and the lower part shows an exemplary pulse sequence for sensing the magnetic field and the electric field using optically detected magnetic resonance (ODMR) techniques. Illustratively, the frequency of the alternating current is about 50 Hz to about 60 Hz. FIG. 8 is an enlarged view of the portion surrounded by a broken line in the pulse sequence shown in the lower part of FIG. 7. Symbols I to V shown in FIG. 8 correspond to States I to V of the pulse sequence shown in FIG. 6.

As mentioned above, regarding the magnetic field and the electric field generated around the electrical equipment 9 through which the alternating current flows, the phase of the magnetic field has a correlation with the phase of the alternating current, and the phase of the electric field has a correlation with the phase of the alternating current voltage. In the present invention, the sensor element 1 is used to measure the phase difference between the magnetic field and the electric field generated around the electrical equipment 9 through which the alternating current flows. In this way, the phase difference between the voltage and the current related to the alternating current flowing through the electrical equipment 9 can be measured with high sensitivity.

The phase difference between the phase of the magnetic field and the phase of the electric field is calculated based on multiple electron spin states after interaction with the magnetic field and the electric field. The electron spin state is acquired, for example, by measuring a magnetic resonance signal using a pulse sequence illustrated in FIGS. 7 and 8 (more specifically, FIG. 6). As illustrated in FIGS. 7 and 8, the pulse sequence shown in FIG. 6 is repeatedly executed multiple times during one cycle of the alternating current, thereby obtaining multiple data of the magnetic resonance signals.

When the frequency of the alternating current flowing through the electrical equipment 9 is, for example, about 60 Hz, the measurement using the pulse sequence illustrated in FIG. 8 is repeated about 512 times during one cycle of the alternating current, and approximately 512 magnetic resonance signals can be acquired as multiple electron spin states after interaction with the magnetic field and the electric field. The data of the approximately 512 magnetic resonance signals is time-series data corresponding to the electron spin states after interaction with the magnetic field. The phase of the magnetic field is calculated by curve fitting the data of the approximately 512 magnetic resonance signals. For example, trigonometric functions such as the sine function and the cosine function are used as functions when fitting the data, for example, four parameters, signal offset, amplitude, frequency, and phase, are used. As with the magnetic field, the phase of the electric field is calculated by curve fitting data of multiple magnetic resonance signals after interaction with the electric field.

Note that when the frequency of the alternating current flowing through the electrical equipment 9 is, for example, about 50 Hz, the measurement using the pulse sequence illustrated in FIG. 8 is repeated about 614 times during one cycle of the alternating current, and approximately 614 magnetic resonance signals can be acquired as multiple electron spin states after interaction with the magnetic field and the electric field.

[Measurement Procedure]

Figure 9:
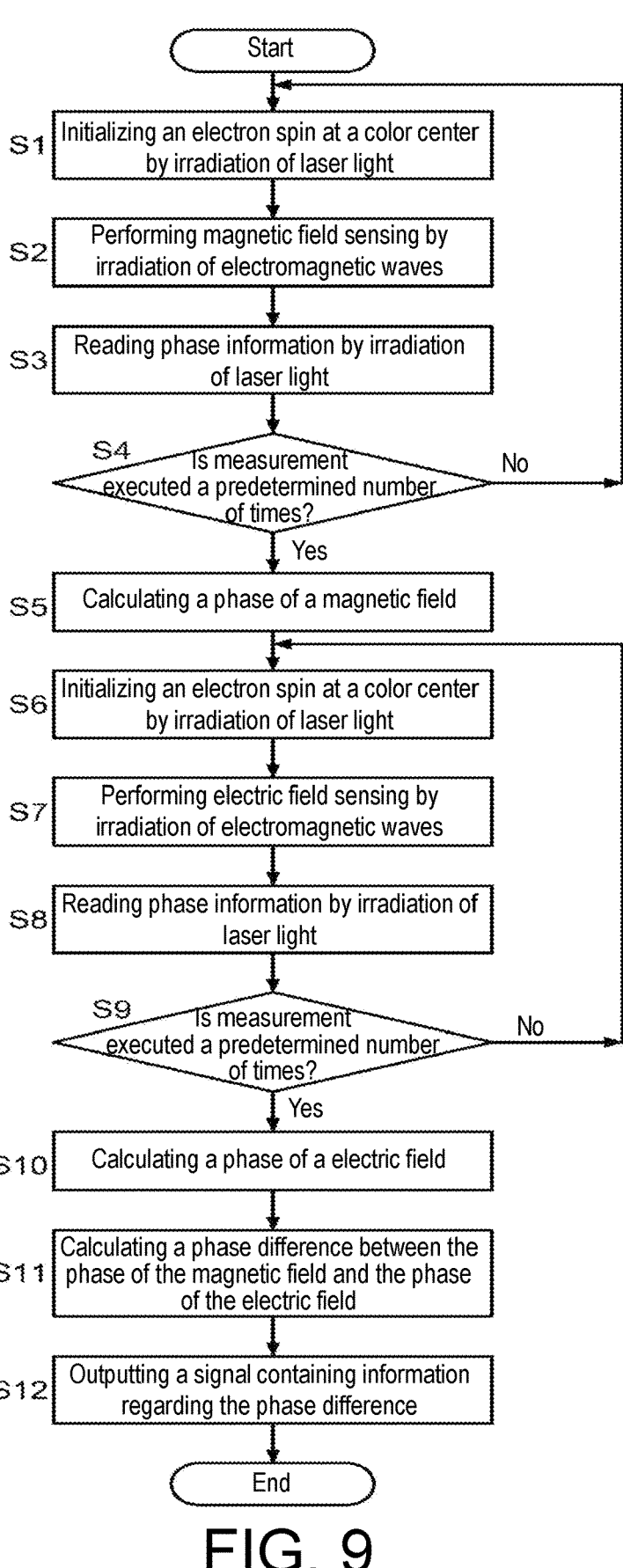
FIG. 9 is a flowchart showing the procedure of a phase difference measurement method according to an embodiment of the present invention.

FIG. 9 is a flowchart showing the procedure of a phase difference measurement method according to an embodiment of the present invention. Steps S1 to S5 are steps for calculating the phase of the magnetic field, and steps S6 to S10 are steps for calculating the phase of the electric field. The phase difference between the magnetic field and the electric field is calculated in step S11, and information regarding the calculated phase difference is output in step S12.

In step S1, the electron spin at the color center (NV center) of the sensor element 1 is initialized by irradiating the sensor element 1 with laser light. Thereafter, the initialized electron spin at the NV center is made to interact with the magnetic field and the electric field generated around the object 9. When the interaction is allowed to occur for a sufficient period of time, the electron spin state at the NV center changes to a state that corresponds to the strength of the magnetic field. The state of step S1 corresponds to State I of the pulse sequence shown in FIG. 6.

In step S2, magnetic field sensing is performed by irradiating the sensor element 1 with electromagnetic waves for spin manipulation. In the embodiment, magnetic field sensing is performed by irradiating two π/2 pulses according to the pulse sequence shown in FIG. 6. That is, in the embodiment, the electron spin state at the NV center is manipulated so as to correspond to States II to IV of the pulse sequence shown in FIG. 6.

In step S3, by irradiating the sensor element 1 with laser light and detecting changes occurring in the sensor element 1, the phase information of the electron spin state after interaction is read. In the embodiment, the phase information of the electron spin state after interaction is read by detecting light emitted from the sensor element 1. The phase information of the electron spin state after the interaction is detected as a change in emission intensity using the change detection unit 32 by the optically detected magnetic resonance (ODMR) method. The magnetic resonance signal detected as the change in the emission intensity represents the phase information of the electron spin state after interaction. The state of step S3 corresponds to State V of the pulse sequence shown in FIG. 6.

In step S4, it is determined whether the series of measurement processes in steps S1 to S3 have been repeatedly executed a predetermined number of times. If the series of measurement processes is repeatedly executed a predetermined number of times (Yes in step S4), the process of step S5 is performed, and if the series of measurement processes has not been repeated a predetermined number of times (No in step S4), the process is performed again from step S1.

As mentioned above, if the frequency of the alternating current flowing through the electrical equipment 9 is, for example, about 50 Hz to about 60 Hz, during one cycle of the alternating current, measurement using the pulse sequence illustrated in FIG. 8 may be performed approximately 512 times, as an example, the series of measurement processes in steps S1 to S3 can be repeatedly executed about 512 times.

In step S5, obtained by the series of measurement processes of steps S1 to S4, the phase of the magnetic field is calculated based on a predetermined number of multiple electron spin states after interaction with the magnetic field and the electric field.

The strength of the magnetic field is calculated from the phase information of the electron spin state after interaction read in step S3. The phase information of the electron spin state after interaction detected by the change detection unit 32 is in a state corresponding to the magnetic field and the electric field of the object 9. Therefore, the strength of the magnetic field can be calculated by appropriately data processing the magnetic resonance signal representing the phase information of the detected electron spin state after interaction. For example, the strength of the magnetic field can be calculated from the measurement results of the electron spin state in the ground state after interaction based on the first term of the Hamiltonian $H_{gs}$ of the electron spin described above due to the Zeeman effect.

For each of the phase information of the electron spin states obtained by the series of measurement processes in steps S1 to S4, by calculating the strength of the magnetic field, data regarding temporal fluctuations in the strength of the magnetic field can be obtained. The phase of the magnetic field is calculated by curve fitting the acquired data regarding temporal fluctuations in the strength of the magnetic field.

In steps S6 to S9, processes similar to steps S1 to S4 are performed. In step S6, the electron spin at the color center (NV center) of the sensor element 1 is initialized by irradiating the sensor element 1 with laser light. Thereafter, the initialized electron spin at the NV center is made to interact with the magnetic field and the electric field generated around the object 9. In step S7, electric field sensing is performed by irradiating the sensor element 1 with electromagnetic waves for spin manipulation. In step S8, by irradiating the sensor element 1 with laser light and detecting changes occurring in the sensor element 1, the phase information of the electron spin state after interaction is read. In step S9, it is determined whether the series of measurement processes in steps S6 to S8 have been repeatedly executed a predetermined number of times. If the series of measurement processes is repeatedly executed a predetermined number of times (Yes in step S9), the process of step S10 is performed, and if the series of measurement processes has not been repeated a predetermined number of times (No in step S9), the process is performed again from step S6.

In step S10, obtained by the series of measurement processes of steps S6 to S9, the phase of the electric field is calculated based on a predetermined number of multiple electron spin states after interaction with the magnetic field and the electric field.

The strength of the electric field is calculated from the phase information of the electron spin state after interaction read in step S8. The phase information of the electron spin state after interaction detected by the change detection unit 32 is in a state corresponding to the magnetic field and the electric field of the object 9. Therefore, the strength of the electric field can be calculated by appropriately data processing the magnetic resonance signal representing the phase information of the detected electron spin state after interaction. For example, the strength of the electric field can be calculated from the measurement results of the electron spin state in the ground state after interaction based on the third term of the electron spin Hamiltonian $H_{gs}$ described above, which functions as an electric field sensor.

For each of the phase information of the electron spin states obtained by the series of measurement processes in steps S6 to S9, by calculating the strength of the electric field, data regarding temporal fluctuations in the strength of the electric field can be obtained. The phase of the electric field is calculated by curve fitting the acquired data regarding temporal fluctuations in the strength of the electric field.

In step S11, the phase difference between the phase of the magnetic field and the phase of the electric field is calculated from the difference between the phase of the magnetic field calculated in step S5 and the phase of the electric field calculated in step S10.

In step S12, a signal containing information regarding the phase difference between the phase of the magnetic field and the phase of the electric field calculated in step S11 is output. The signal containing the information regarding the phase difference is transmitted via the network 99, for example, and is used to adjust the power factor by the phase adjustment equipment.

Effect

As described above, the present invention may measure, with high sensitivity, the phase difference between the magnetic field and the electric field generated around the electrical equipment through which the alternating current flows. As a result, even in the electrical equipment where large currents or high voltages are flowing, a protection circuit is not needed to protect the circuits from large currents or high voltages, and the phase difference of the voltage and the current related to the alternating current may be measured. Since no protection circuit is needed, the scale and cost of the electrical equipment can be reduced.

In the present invention, the phase difference between the magnetic field and the electric field generated around the electrical equipment through which the alternating current flows is measured using the sensor element of a quantum sensor. In this way, the phase difference between the voltage and the current related to the alternating current flowing through the electrical equipment may be measured with high sensitivity. The magnetic resonance signals used to calculate the phase of the magnetic field and the phase of the electric field are detected by the optically detected magnetic resonance (ODMR) method. In this way, the phase difference between the voltage and the current related to the alternating current flowing through the electrical equipment may be measured in a non-contact manner without direct electrical connection to the electrical equipment.

[Other Forms]

Although the present invention has been described above using specific embodiments, the present invention is not limited to the above-described embodiments.

In the above-described embodiment, the pulse sequence of the electromagnetic waves irradiated by the electromagnetic irradiation unit 2 to the sensor element 1 uses a pulse sequence for observing a free induction decay (FID) signal, as illustrated in FIG. 6, but the pulse sequence used when detecting magnetic resonance signals is not limited thereto. As described with reference to FIGS. 10 to 12, instead of observing a free induction decay (FID) signal, spin echo signals may be observed as the magnetic resonance signals using a pulse sequence based on the Hahn echo method.

<Pulse Sequence for Measuring Curvature of AC Signal>

Figure 10:
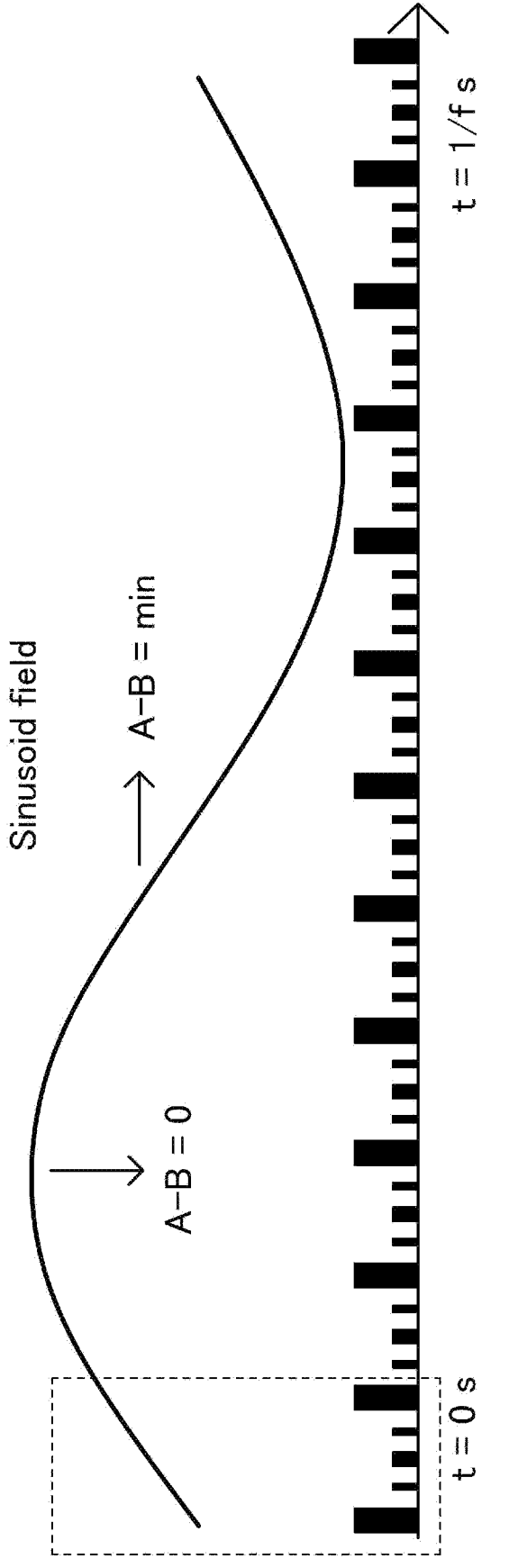
FIG. 10 is a diagram for describing another aspect of the concept of phase difference measurement of the present invention.
Figure 11:
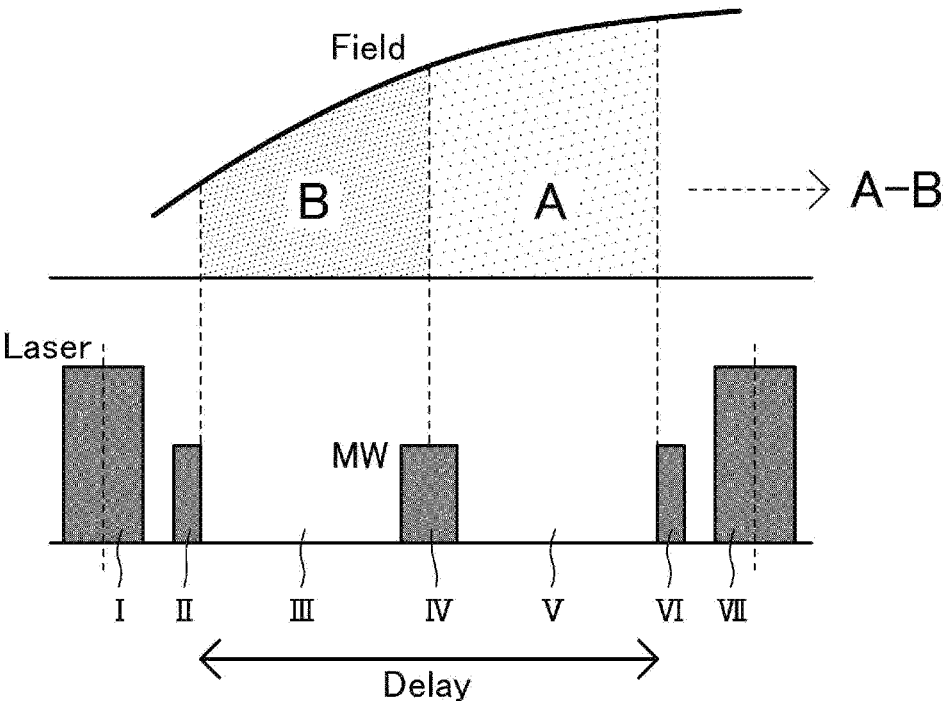
FIG. 11 is a diagram for describing another aspect of the concept of phase difference measurement of the present invention.

FIGS. 10 and 11 are diagrams for describing another aspect of the concept of phase difference measurement of the present invention.

In FIG. 10, the upper part shows temporal fluctuations of the alternating current flowing through the electrical equipment, which is the object 9, and the lower part shows another exemplary pulse sequence for sensing the magnetic field and the electric field using optically detected magnetic resonance (ODMR) techniques. Illustratively, the frequency of the alternating current is about 50 Hz to about 60 Hz. FIG. 11 is an enlarged view of the portion surrounded by a broken line in the pulse sequence shown in the lower part of FIG. 10. Symbols I to VII shown in FIG. 11 correspond to States I to V of the pulse sequence shown in FIG. 12.

Figure 12:
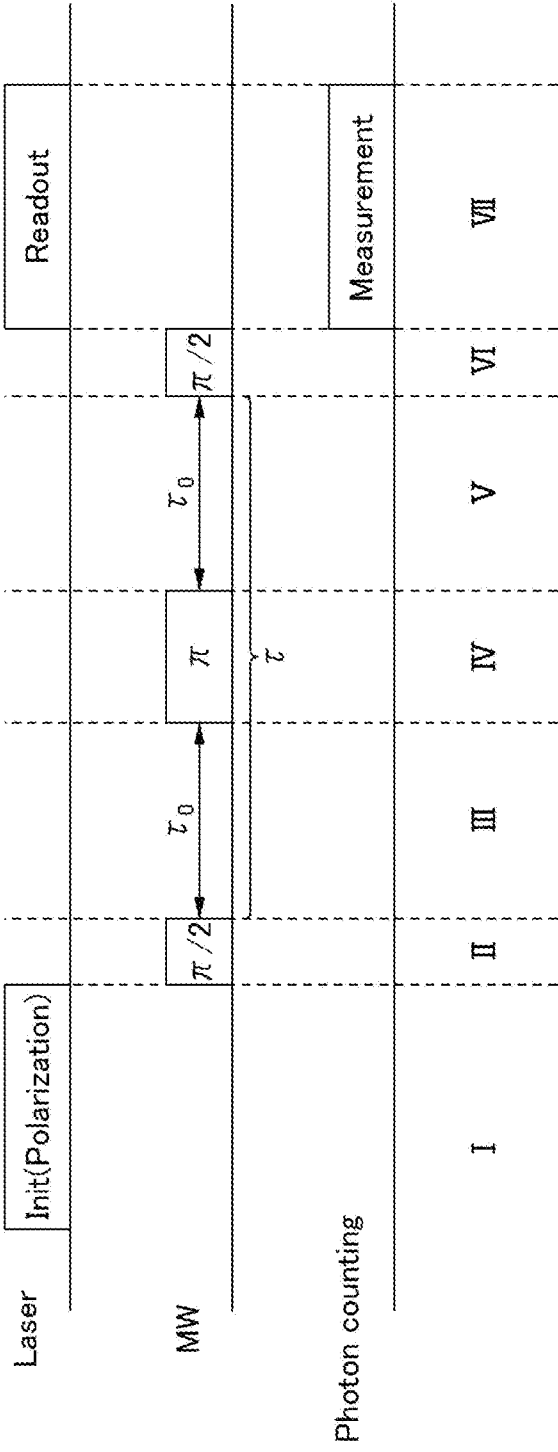
FIG. 12 is another exemplary pulse sequence when sensing a magnetic field by a method using the optically detected magnetic resonance (ODMR) method, which is a pulse sequence for observing a spin echo signal.

In another aspect of the concept of phase difference measurement of the present invention, the electron spin state is acquired, for example, by measuring magnetic resonance signals using the pulse sequence illustrated in FIGS. 10 and 11 (more specifically, FIG. 12). Similar to the concept of phase difference measurement of the present invention described with reference to FIGS. 6 to 8, as illustrated in FIGS. 10 and 11, the pulse sequence shown in FIG. 12 is repeatedly executed multiple times during one cycle of the alternating current, thereby obtaining multiple data of the magnetic resonance signals.

FIG. 12 is another exemplary pulse sequence when sensing a magnetic field using the optically detected magnetic resonance (ODMR) method. The pulse sequence of the electromagnetic wave for operation shown in FIG. 12 is a pulse sequence for observing a spin echo signal using a pulse sequence including two $\pi/2$ pulses and a $\pi$ pulse therebetween based on the spin echo method (Hahn echo method).

States I to VII of the pulse sequence shown in FIG. 12 will be described. State I represents a state in which an electron spin is initialized by irradiation of laser light. In the Bloch sphere, which is a notation method for expressing quantum states on a unit sphere, the electron spin is aligned in the direction along a z-axis, which is the quantization axis.

Next, by irradiating a $\pi/2$ pulse in State II, an operation is performed to tilt the electron spin along the quantization axis to a plane perpendicular to the quantization axis. The electron spin is thrown onto an xy plane. Thereafter, the electron spin which has been thrown onto the xy plane undergoes phase relaxation in State III during a predetermined time $\tau_0$ by interaction with an alternating magnetic field and a static magnetic field. The strength of the interaction corresponds to the strength of the magnetic field felt by the electron spin, and corresponds to region B shown in FIG. 11.

After the predetermined time $\tau_0$ has elapsed in State III, by irradiating a $\pi$ pulse in State IV, an operation is performed to invert within a plane the electron spin whose phase has been relaxed due to interaction with a measurement target. From States III to IV, the electron spin is rotating in the xy plane. At this time, in State V after reversal, a static magnetic field component is canceled due to refocusing of the electron spin, but an AC magnetic field component is not canceled because the strength of the AC magnetic field component is reversed compared to State III.

Thereafter, while the predetermined time to elapses in State V. the electron spin undergoes phase relaxation due to interaction with the alternating magnetic field and the static magnetic field, similar to State III. The strength of the interaction corresponds to the strength of the magnetic field felt by the electron spin, and corresponds to region A shown in FIG. 11.

After the predetermined time $\tau_0$ has elapsed in State V, a $\pi/2$ pulse is irradiated in State VI to project the phase-relaxed electron spin onto the quantization axis. The electron spin located in the xy plane is projected onto the z-axis, which is the quantization axis, and is aligned in the direction along the z-axis.

After that, in State VII, phase information of the electron spin state after interaction is read by irradiating the sensor element with laser light and detecting the light emitted from the sensor element.

Similarly to the magnetic field, the electric field can also be sensed using the pulse sequence illustrated in FIG. 12.

As described with reference to FIG. 12, the pulse sequence based on the spin echo method includes a $\pi$ pulse between two $\pi/2$ pulses. As shown in State IV, the electron spin is reversed along the z-axis in the Bloch sphere by irradiation with the $\pi$ pulse. In this way, the observed spin echo signal reflects the curvature of the magnetic field and the curvature of the electric field to be sensed, as shown in FIG. 11. As shown in FIG. 11, by reversing the electron spin in State IV, the phase information (magnetic resonance signals) of the electron spin state after interaction read in State VII reflects the difference (A–B) between the region A shown in FIG. 11 and the region B shown in FIG. 12.

As shown in FIG. 11, the alternating current repeatedly increases and decreases periodically. As the alternating current changes periodically, the period of the magnetic field and the period of the electric field to be sensed also change. In a periodic alternating current, when the alternating current signal increases, the difference (A–B) represented by the magnetic resonance signal read in State VII becomes a positive value. At the peak of the signal where the alternating current signal takes an extreme value, the difference (A–B) becomes 0 (zero), and when the alternating current signal decreases, the difference (A–B) becomes a negative value.

In the embodiment described above, the magnetic resonance signals used to calculate the strength of the magnetic field and the strength of the electric field are detected by the optically detected magnetic resonance (ODMR) method, but the method used to detect magnetic resonance signals is not limited to the optically detected magnetic resonance (ODMR) method. Instead of the optically detected magnetic resonance (ODMR) method, the magnetic resonance signals can also be detected, for example, by the electrically detected magnetic resonance (EDMR) method. In this case, a pair of measurement electrodes for detecting magnetic resonance signals are electrically connected to the sensor element 1. A bias voltage is applied between the pair of measurement electrodes, and an electric field is applied to the sensor element 1 through the measurement electrodes.

In the embodiment described above, the phase difference measurement device 10 measures the phase difference between the magnetic field and the electric field generated around the electrical equipment 9. Although transformers such as the current transformer 9a and the transformer 9b are illustrated as examples of the electrical equipment 9, the electrical equipment 9 is not limited thereto. The electrical equipment 9 can be, for example, power transmission and transformation equipment such as a transformer or a switch, or an electric line such as a power transmission line or a power distribution line, and the phase difference measurement device 10 is attached to such electrical equipment 9 and can measure the phase difference between the magnetic field and the electric field generated around the electrical equipment 9.

In the embodiment described above, one measurement device 10 is disposed in one electrical equipment 9, and the one measurement device measures the phase of the magnetic field and the phase of the electric field, multiple measurement device 10 and measurement device 10 may be disposed in the one electrical equipment 9, and each of the measurement devices 10 may measure the phase of the magnetic field and the phase of the electric field, respectively. In this case, multiple measurement device 10 and measurement device 10 may coordinate operations and data, and share and process steps S1 to S12.

For example, the first measurement device 10 calculates the phase of the magnetic field by performing the processing of steps S1 to S5, the second measurement device 10 calculates the phase of the electric field by performing the processing of steps S6 to S10, and either the first measurement device or the second measurement device 10 calculates the phase difference between the magnetic field and the electric field by performing the processing of steps S11 and S12. By coordinating the operations and data of the measurement device 10 and the measurement device 10, the processing of steps S1 to S5 for calculating the phase of the magnetic field and the processing of steps S6 to S10 for calculating the phase of the electric field can be performed in parallel.

In the embodiment described above, regarding the magnetic field and the electric field generated around the electrical equipment 9, although the phase difference between the phase of the magnetic field and the phase of the electric field is measured, the type of physical quantity for which the phase difference is to be measured is not limited to the magnetic field and the electric field. The types of physical quantities to be measured by the phase difference measurement device 10 can be the magnetic field, the electric field, temperatures, and mechanical quantities described in the spin Hamiltonian $H_{gs}$ of the electron spin mentioned above, the phase difference measurement device 10 measures the phase difference between the physical fields, that is, the phase difference between two physical fields selected from the types of physical fields (the magnetic field, the electric field, temperatures, and mechanical quantities) can be measured.

The combination of two physical fields may have different types of physical fields, such as a magnetic field and an electric field, or may have the same type of physical fields, such as two different magnetic fields. In the former case, for example, as illustrated in the above embodiment, focusing on one certain electrical equipment 9, the phase difference measurement device 10 may measure the phase difference between the phase of the magnetic field and the phase of the electric field generated around the electrical equipment 9. In the latter case, for example, focusing on two different electrical equipment 9, the phase difference measurement device 10 may measure the phase difference between the phase of the magnetic field generated around one of the electrical equipment 9 and the phase of the magnetic field generated around the other one of the electrical equipment 9.

The physical field to be measured by the phase difference measurement device 10 is not limited to the physical field occurring around the electrical equipment 9, and the phase difference measurement device 10 can measure the phase difference between multiple physical fields occurring around various devices through which the alternating current flows.

EXAMPLE

Examples of the present invention will be shown below to clarify the characteristics of the present invention.

Example 1

In Example 1, numerical simulation was performed using a free induction decay (FID) signal.
<Numerical Simulation Conditions>
The pulse sequence was a simple FID sequence. As each of measurements relied on a single sequence, no accumulation of magnetic resonance signals was performed. The frequency of the alternating current was 60 Hz, and the pulse sequence was repeated approximately 512 times.

Conditions (a) to (f) assumed for the sensor element sample and the pulse sequence are as follows.

(a) Coherence time $T_2{*}$ is 1 μs. For $T_2{*}$=1 μs, the total concentration at the NV center is about 10 ppm.

(b) The diameter of the laser spot is 10 μm, and the NV center density "NV" is 0.5 ppm (=$8.8{\times}3{\times}10^{16}$ cm$^{-3}$). Therefore, the number of NV centers within the spherical volume is approximately $4.6{\times}10^7$.

(c) Contrast is 1%. Note that contrast may be about 10% between spin states.

(d) Average of 0.1 photons per readout per NV center.

(e) The pulse sequence for measuring the FID signal is a pulse sequence including two π/2 pulses as illustrated in FIG. 6.

(f) The laser pulse length is 30 μs, the waiting time between the laser pulse and the first π/2 pulse is 1 μs, the π/2 pulse length is 40 ns, and the delay between the pulses is 0.5 μs.

In Example 1, the strength of the magnetic field was assumed to be an amplitude of 40 μT, and the strength of the electric field was assumed to be an amplitude of 20 kV/cm.

<Results of Numerical Simulation>

Figures 13A, 13B:
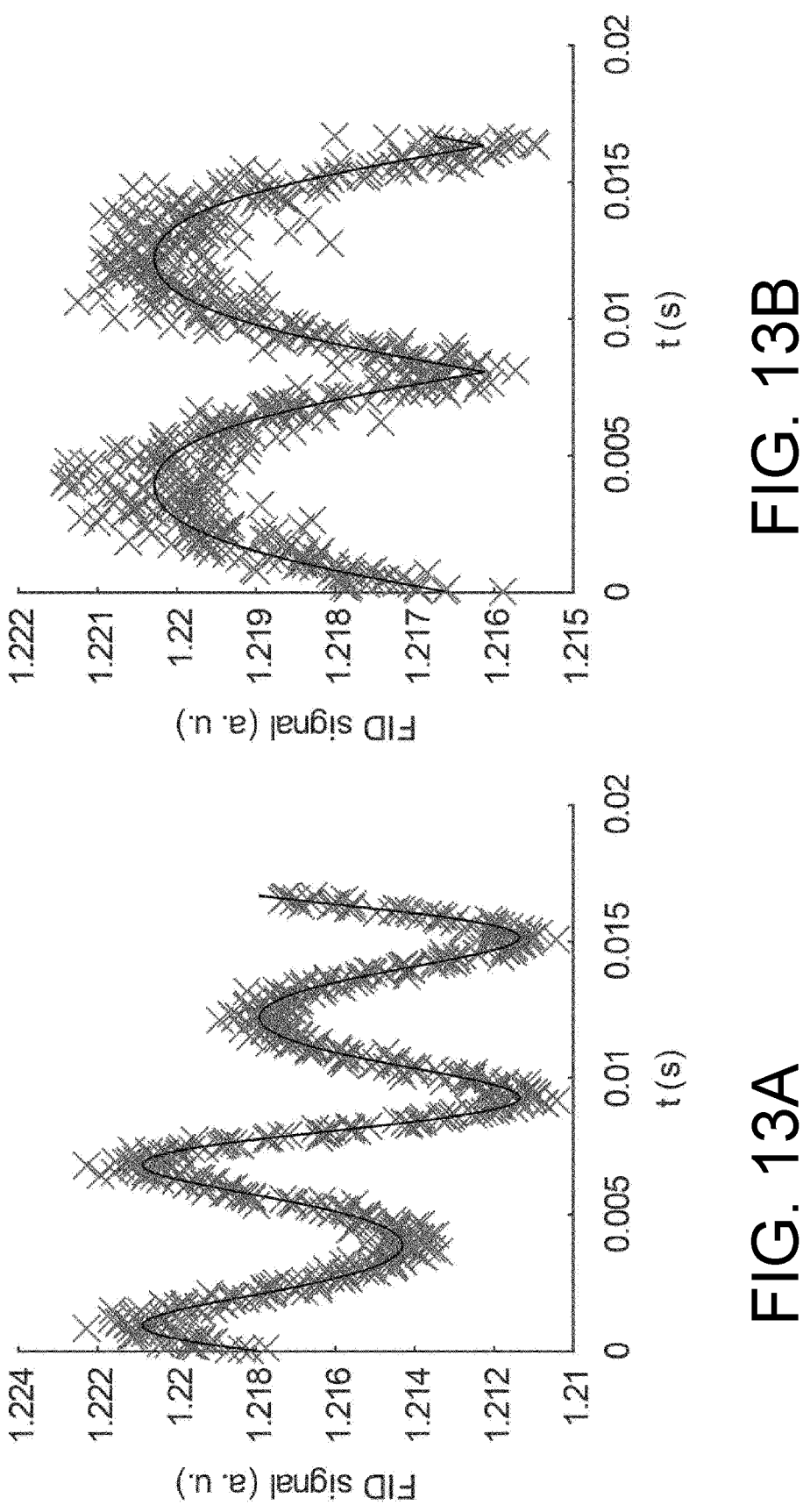
FIGS. 13A and 13B show results of numerical simulation regarding phase measurement of magnetic fields and electric fields according to Example 1.

FIGS. 13A and 13B show results of numerical simulation regarding the phase measurement of the magnetic field and the electric field according to Example 1.

FIG. 13A is the result of simulation regarding the phase measurement of the magnetic field, and FIG. 13B is the result of simulation regarding the phase measurement of the electric field.

The amplitude of the strength of the magnetic field depends on a distance r from a current line (wire). When the distance r is 0.1 m, the amplitude of the strength of the magnetic field is about 2 mT and attenuates by 1/r. The amplitude of the strength of the magnetic field of 40 μT assumed in the numerical simulation of Example 1 corresponds to a distance of about 5 m from the current line. Just for reference, the effect of a magnetic field on the spin Hamiltonian is known to be about 28 GHz. $T^{-1}$. The results are shown in FIG. 13A.

Multiple points plotted with cross symbols "x" in FIG. 13A are simulated values of the signal strength of the free induction decay (FID) signal, which corresponds to the strength of the magnetic field. By curve fitting the points plotted with the cross symbols "x", a phase of the magnetic field $\varphi_B$=101.3±5.6 mrad was obtained.

The amplitude of the strength of the electric field depends on a distance d between the current line (wire) and a ground-plane where the sample of the diamond NV center is disposed. When the distance d is 1 m, the amplitude of the strength of the electric field is about 0.2 kV/cm and attenuates at 1/d. The amplitude of the strength of the electric field of 20 kV/cm assumed in the numerical simulation of Example 1 corresponds to a distance of about 1 cm from the current line. Just for reference, the effect of a vertical electric field on the spin Hamiltonian is known to be about 17 Hz $cmV^{-1}$. The direction of the electric field had no effect, and in the simulation the effect was modeled in the same way as the magnetic field. The results are shown in FIG. 13B.

Multiple points plotted with cross symbols "x" in FIG. 13B are simulated values of the signal strength of the free induction decay (FID) signal, which corresponds to the strength of the electric field. By curve fitting the points plotting with the cross symbols "x", a phase of the electric field $\varphi_E$=86.2 mrad and an error of +16.4 mrad to −15.74 mrad were obtained.

Example 2

In Example 2, numerical simulation was performed with the distance from the current line (wire) changed from Example 1. Unless otherwise mentioned, the conditions for the numerical simulation in Example 2 were the same as the conditions for the numerical simulation in Example 1.

In Example 2, the strength of the magnetic field was assumed to be an amplitude of 200 μT, and the strength of the electric field was assumed to be an amplitude of 200 kV/cm.

<Results of Numerical Simulation>

Figures 14A, 14B:
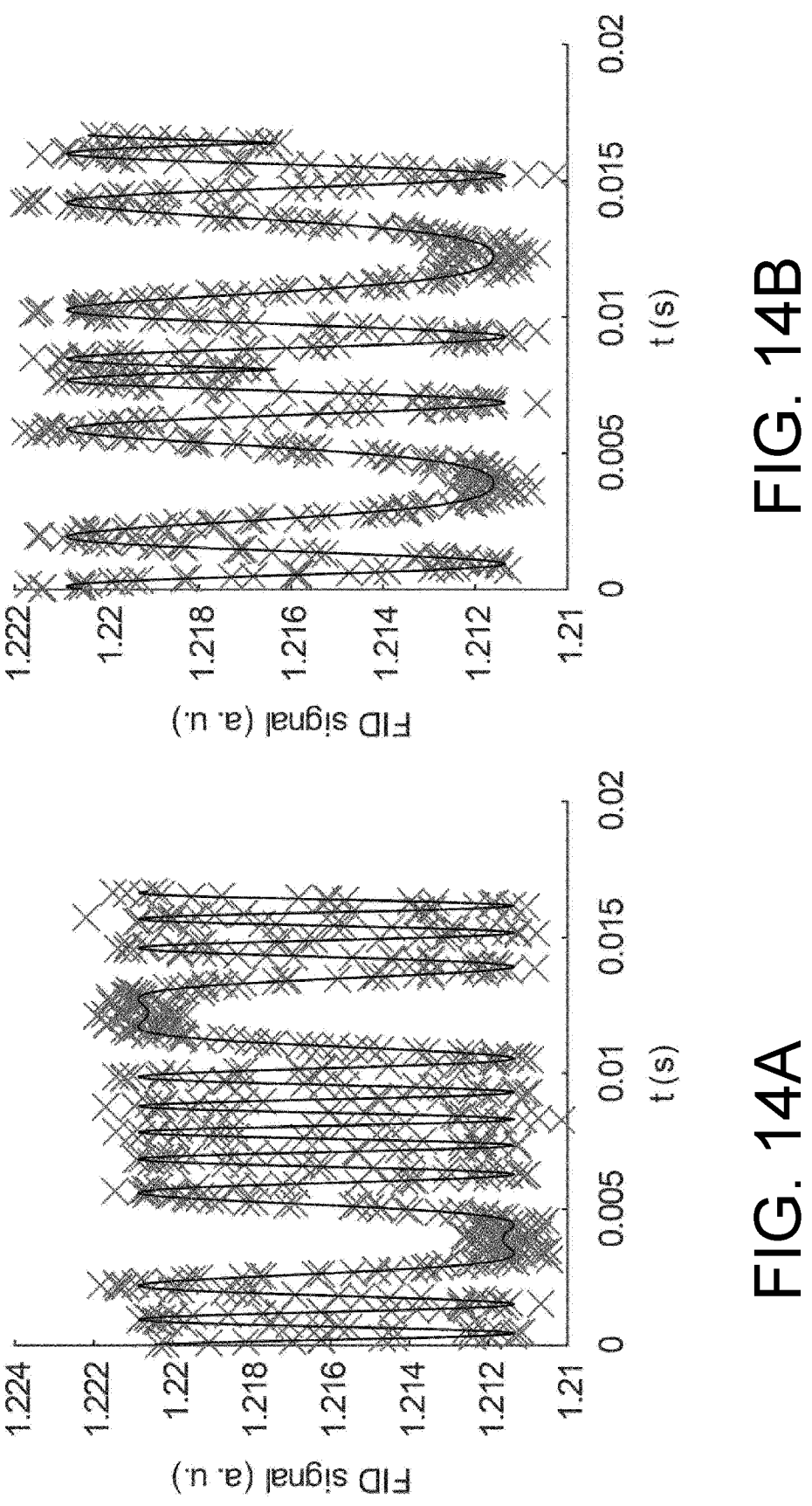
FIGS. 14A and 14B show results of numerical simulation regarding phase measurement of magnetic fields and electric fields according to Example 2.

FIGS. 14A and 14B show results of numerical simulation regarding the phase measurement of the magnetic field and the electric field according to Example 2.

FIG. 14A is the result of simulation regarding the phase measurement of the magnetic field, and FIG. 14B is the result of simulation regarding the phase measurement of the electric field.

The amplitude of the strength of the magnetic field of 200 μT assumed in the numerical simulation of Example 2 corresponds to a distance of about 1 m from the current line. The results are shown in FIG. 14A. By curve fitting the points plotted with the cross symbols "x" in FIG. 14A, the phase of the magnetic field $\varphi_B$=100.2±1.1 mrad was obtained.

The amplitude of the strength of the electric field of 200 kV/cm assumed in the numerical simulation of Example 2 corresponds to a distance of about 1 mm from the current line. The results are shown in FIG. 14B. By curve fitting the points plotted with the cross symbols "x" in FIG. 14B, the phase of the electric field $\varphi_E$=100.2±1.9 mrad was obtained.

<Consideration>

It is assumed that the magnitude of the large currents and high voltages that actually flow through the power lines of the power system, and it is assumed that the numerical values of the measurement conditions as shown below, for the alternating current supplied via the current line (wire), the measurement accuracy required to measure the phase difference between the magnetic field and the electric field during one cycle of the alternating current is approximately 5.82 mrad.

[Measurement Conditions]

Frequency f: 50/60 Hz

Voltage $V_{amplitude}$: Approximately $2 \times 10^4$ V

Current $I_{amplitude}$: Approximately $10^3$ A

The distance from the current line assumed in Example 1, that is, at the distance between the current line and the sample of the diamond NV center, the error in the phase of the magnetic field $\varphi_B$ according to the numerical simulation was ±5.6 mrad, the error in the phase of the electric field $\varphi_E$ was +16.4 mrad or −15.74 mrad. Among the errors in $\varphi_B$ and $\varphi_E$, the phase of the electric field $\varphi_E$ in particular greatly exceeded the above-mentioned required measurement accuracy of approximately 5.82 mrad, which was thought to be a hurdle in realizing the distance from the current line assumed in Example 1.

On the other hand, at the distance from the current line assumed in Example 2, which was assumed to be shorter than in Example 1, the error in the phase of the magnetic field $\varphi_B$ according to the numerical simulation was ±1.1 mrad, and the error in the phase of the electric field $\varphi_E$ was ±1.9 mrad.

Therefore, the distance from the current line assumed in Example 2 was by disposing the sample of the diamond NV center at a distance of approximately 1 m for measurement of the magnetic field and approximately 1 mm for measurement of the electric field, regarding the large current and high voltage alternating current that actually flowed through the electrical line of the power system, the numerical simulation showed that the phase difference between the voltage and the current was able to be actually measured with sufficient measurement accuracy.

Example 3

In Example 3, numerical simulation was performed using a spin echo signal.

23

<Numerical Simulation Conditions>
The pulse sequence was based on the spin echo method (Hahn echo method). As each of measurements relied on a single sequence, no accumulation of magnetic resonance signals was performed. The frequency of the alternating current was 60 Hz, and the pulse sequence was repeated approximately 204 times.

Conditions (a) to (f) assumed for the sensor element sample and the pulse sequence are as follows.

(a) Coherence time $T_2$ is 100 μs.

(b) The sensor volume is $8.5 \times 10^{-4}$ mm$^3$ and the number of NV centers is $10^{11}$.

(c) Contrast is 0.5%. Note that between the spin states, if the NV centers are not aligned, contrast may be 7.5%, and if the NV centers are aligned, contrast may be 30%.

(d) Average of 0.1 photons per readout per NV center.

(e) The pulse sequence for measuring the spin echo signal is a pulse sequence including a π pulse between two π/2 pulses, as illustrated in FIG. 12.

(f) The laser pulse length is 30 μs, the waiting time between the laser pulse and the first π/2 pulse is 1 μs, the π/2 pulse length is 40 ns, and the delay between the π/2 pulses is 50 μs.

In Example 3, it was assumed that the sample of the diamond NV center was disposed at the same distance as in Example 1. That is, as in Example 1, the strength of the magnetic field was assumed to be an amplitude of 40 μT, and the strength of the electric field was assumed to be an amplitude of 20 kV/cm.

Figures 15A, 15B:
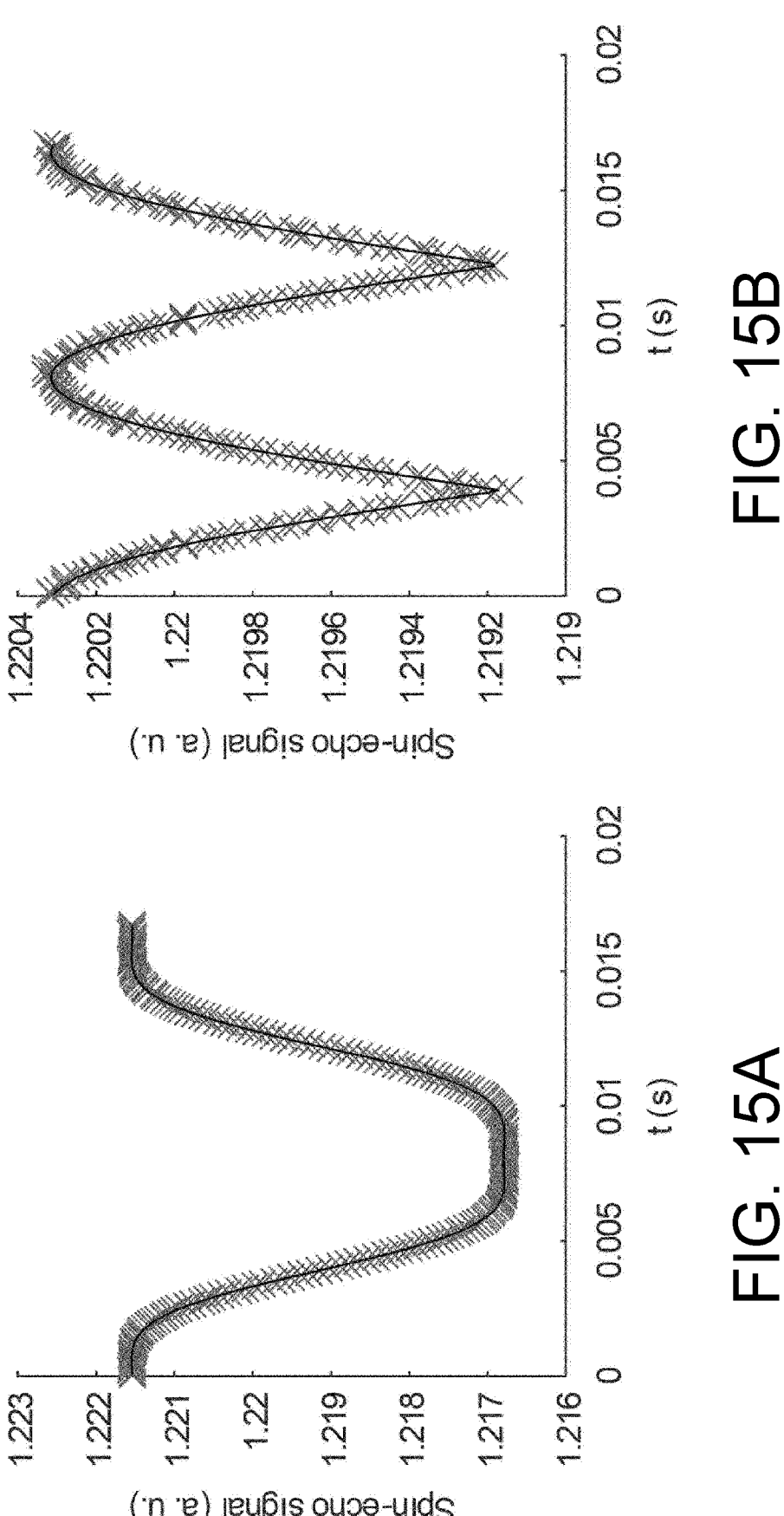
FIGS. 15A and 15B show results of numerical simulation regarding phase measurement of magnetic fields and electric fields according to Example 3.

<Results of Numerical Simulation>
FIGS. 15A and 15B show results of numerical simulation regarding the phase measurement of the magnetic field and the electric field according to Example 3. FIG. 15A is the result of simulation regarding the phase measurement of the magnetic field, and FIG. 15B is the result of simulation regarding the phase measurement of the electric field.

Note that in a pulse sequence based on the spin echo method, electron spins are reversed along the z-axis in the Bloch sphere by irradiation with a π pulse. As a result, the observed spin echo signal includes information corresponding to the curvature of the alternating current. Because the curvature is measured in terms of derivatives, curves shown in FIGS. 15A and 15B look like cosine waves rather than sinusoidal waves.

Multiple points plotted with cross symbols "x" in FIG. 15A are simulated values of the signal strength of the spin echo signal corresponding to the strength of the magnetic field. By curve fitting the points plotting with the cross symbols "x", the phase of the magnetic field $\varphi_B$=100.3 mrad and an error of +0.8 mrad to −0.9 mrad were obtained.

Multiple points plotted with cross symbols "x" in FIG. 15B are simulated values of the signal strength of the spin echo signal corresponding to the strength of the electric field. By curve fitting the points plotted with the cross symbols "x", the phase of the electric field $\varphi_E$=101.5±2.2 mrad was obtained.

According to the results of Example 3, it was verified that both the error in the phase of the magnetic field $\varphi_B$ and the error in the phase of the electric field $\varphi_E$ were significantly lower than the above-mentioned required measurement accuracy of approximately 5.82 mrad.

<Consideration>
The phase measurement accuracy obtained by numerical simulation was compared between Example 1 and Example 3. The results of the numerical simulation according to Example 3 were superior to the results of the numerical simulation according to Example 1 in terms of both the error in the phase of the magnetic field $\varphi_B$ and the error in the phase of the electric field DE. The assumed distance from the current line, that is, the distance between the current line and the sample of the diamond NV center, was the same in Examples 1 and 3. To detect magnetic resonance signals, the simulation was performed assuming a pulse sequence for observing a free induction decay (FID) signal in Example 1, and the simulation was performed assuming a pulse sequence based on the spin echo method for observing a spin echo signal in Example 3.

Therefore, when disposing the sample of the diamond NV center at the same distance from the current line, numerical simulations have shown that the magnetic resonance signals are exemplary observed using a pulse sequence based on the spin echo method for observing a spin echo signal rather than a pulse sequence for observing a free induction decay (FID) signal.

Example 4

In Example 4, improvements were made to the phase difference measurement device, and whether or not the improvements improved performance was verified. In Example 4, two improvements were made. In the first improvement, improvements were made to the phase difference measurement device to correct the pulse period shift. In the second improvement, improvements were made to multiple phase difference measurement devices to correct phase shifts.

Figure 16A:
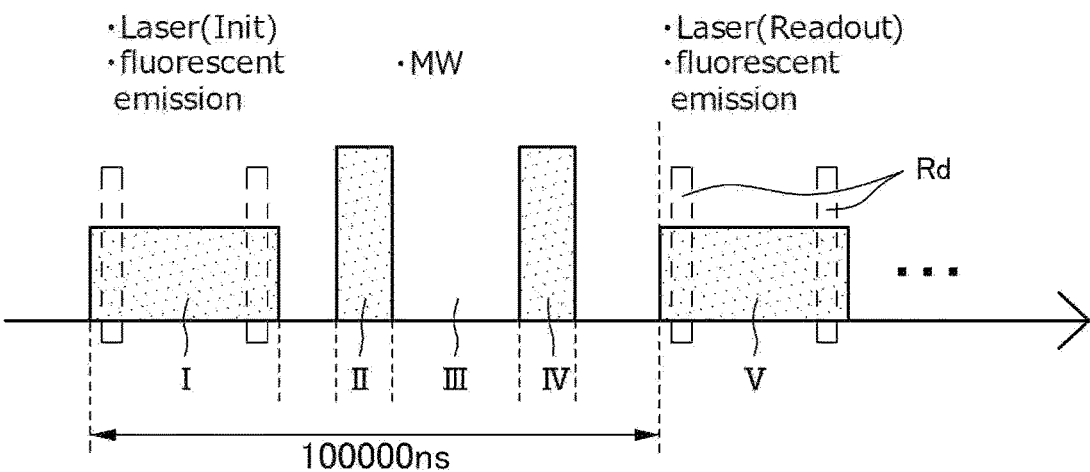
FIGS. 16A, 16B and 16C are diagrams for describing the concept of the first improvement according to Example 4.
Figure 16B:
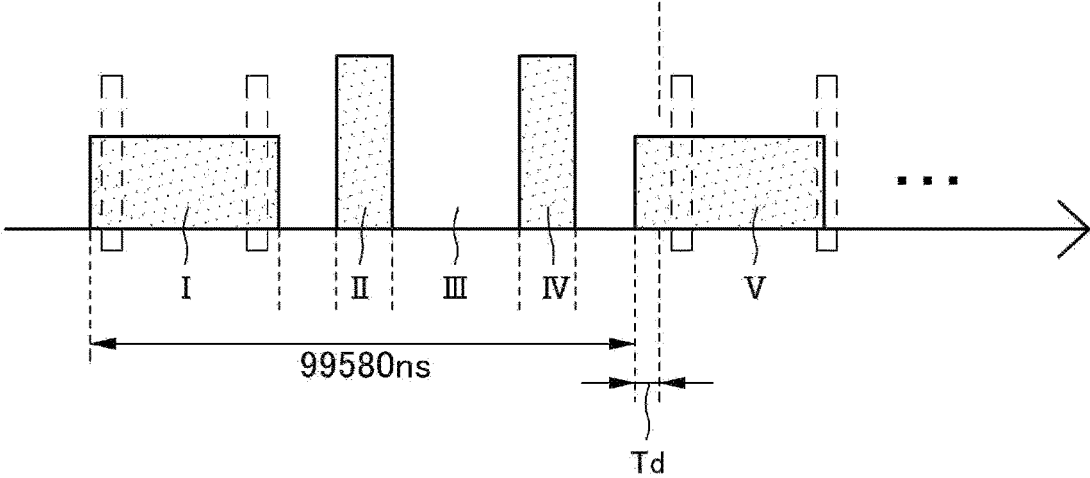
Figure 16C:
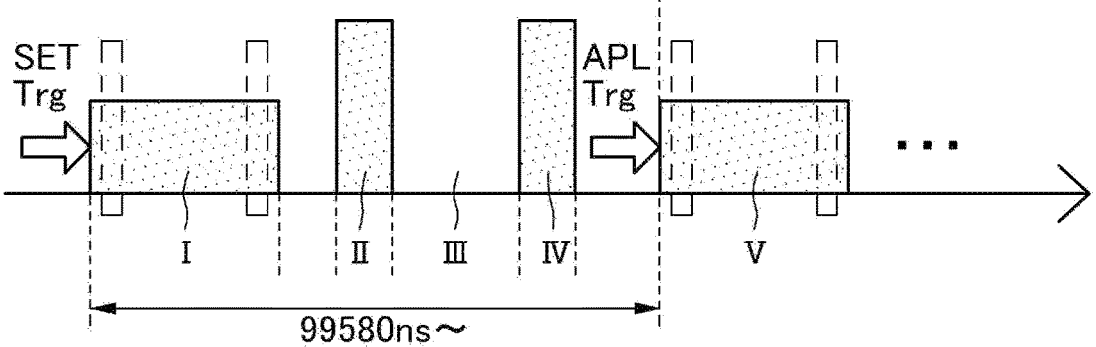

FIGS. 16A, 16B and 16C are diagrams for describing the concept of the first improvement according to Example 4. The pulse sequence shown in FIGS. 16A, 16B and 16C corresponds to the pulse sequence shown in FIG. 6 or the part surrounded by a broken line in the pulse sequence shown in FIG. 8. Symbols I to IV in the figure correspond to States I to IV shown in FIG. 6, FIG. 8, etc. FIGS. 16A, 16B and 16C illustrate the relationship between the pulse sequence and the data readout timing (phase information of the electron spin state) by irradiation of laser light. In the figure, a symbol Rd indicates the range of data read by the laser light.

The ideal pulse sequence and data readout timing to be set in the device are as shown in FIG. 16A. On the other hand, the pulse sequence and data readout timing during actual measurement were as shown in FIG. 16B. As shown in FIG. 16B, in actual measurement, a shift in the pulse period occurred due to the limit of the clock frequency generated by a pulse pattern generator, due to this, the range Rd of data read by the laser light may also sometimes deviate from the irradiation timing of the laser light (timing of fluorescence emission) corresponding to State V by a time indicated by a symbol Td. The pulse pattern generator is a waveform signal generator such as a pattern generator, a function generator, or a pulse streamer.

In the first improvement, as shown in FIG. 16C, a predetermined fluorescence intensity was set in a trigger $T_{rg}$ and applied to timing adjustment to correct the pulse period shift. In the example, the magnitude of the fluorescence intensity set for the trigger (a trigger level of the pulse pattern generator) was about 5% to about 90% of the fluorescence intensity of the rising portion emitted from the sensor element during initialization of the electron spin by irradiation of the laser light shown in State I. If the trigger level is set higher than 90%, the trigger cannot be read when a large magnetic resonance of about 10% occurs. Moreover, if the trigger level is smaller than 5%, there is a risk that shot noise may be mistakenly interpreted as a trigger. The set trigger was applied to adjust the data readout timing by irradiation of the laser light shown in State V. Timing correction by applying a trigger was performed for each of pulses. The fluorescence intensity serving as a trigger was set by the data processing unit 33 (PC).

Note that the lower limit of the trigger level can be set based on quantum noise or shot noise, the upper limit can be set based on the maximum value of the spin contrast ratio, and ranges of trigger levels can be set within the ranges aforementioned.

Figure 17:
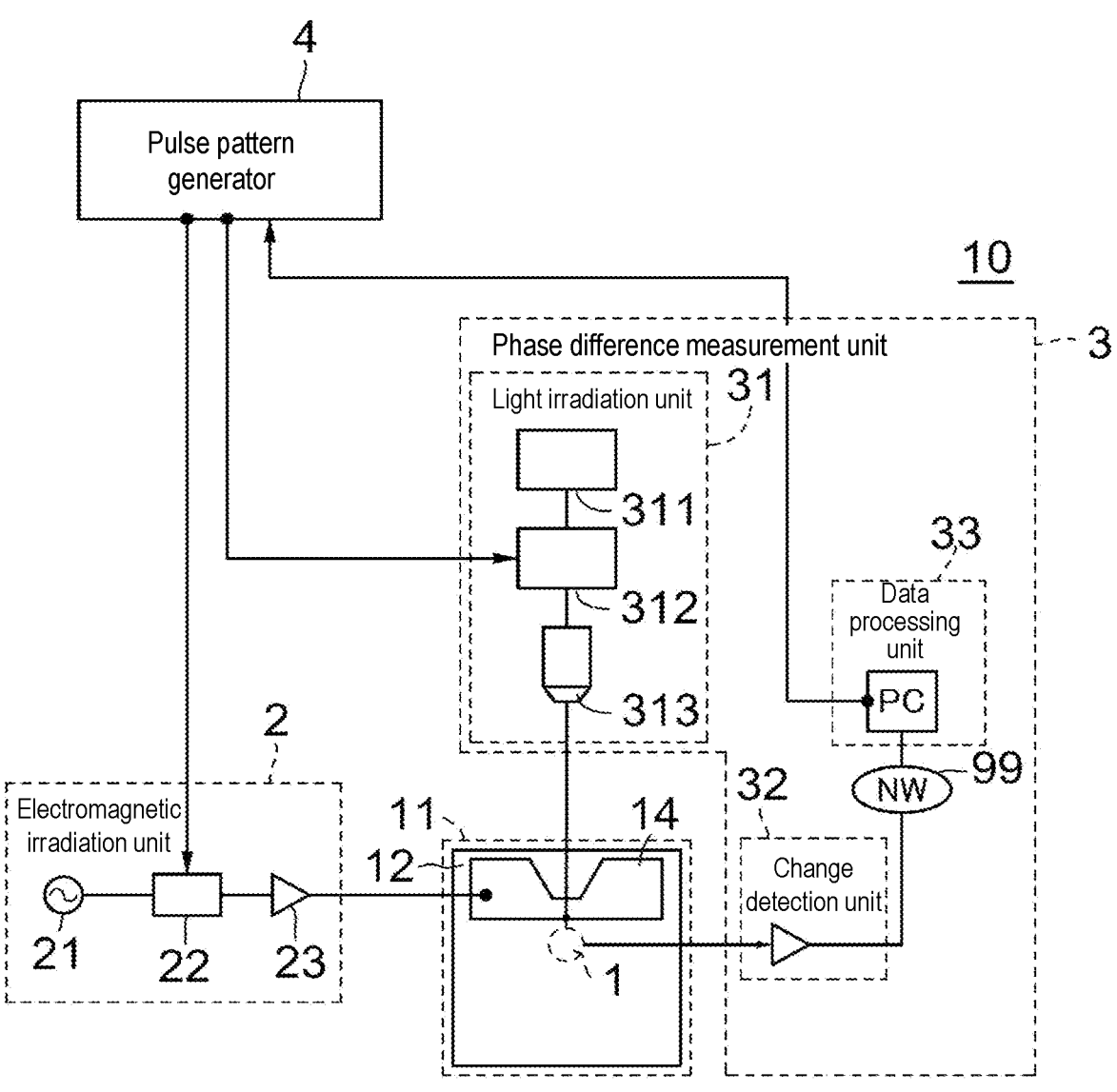
FIG. 17 is a diagram schematically showing a schematic configuration of the phase difference measurement device 10 with the first improvement according to Example 4 being applied.

FIG. 17 is a diagram schematically showing a schematic configuration of the phase difference measurement device 10 that has undergone the first improvement. As shown in FIG. 17, the first improved phase difference measurement device 10 further includes a pulse pattern generator 4 in which a trigger is set for correcting a pulse period shift. The pulse pattern generator 4 uses the fluorescence intensity when initializing the electron spin state as a trigger, a pulse signal for operation timing is output to the electromagnetic irradiation unit 2 and the light irradiation unit 31 to correct the deviation in a measurement cycle.

Figure 18A:
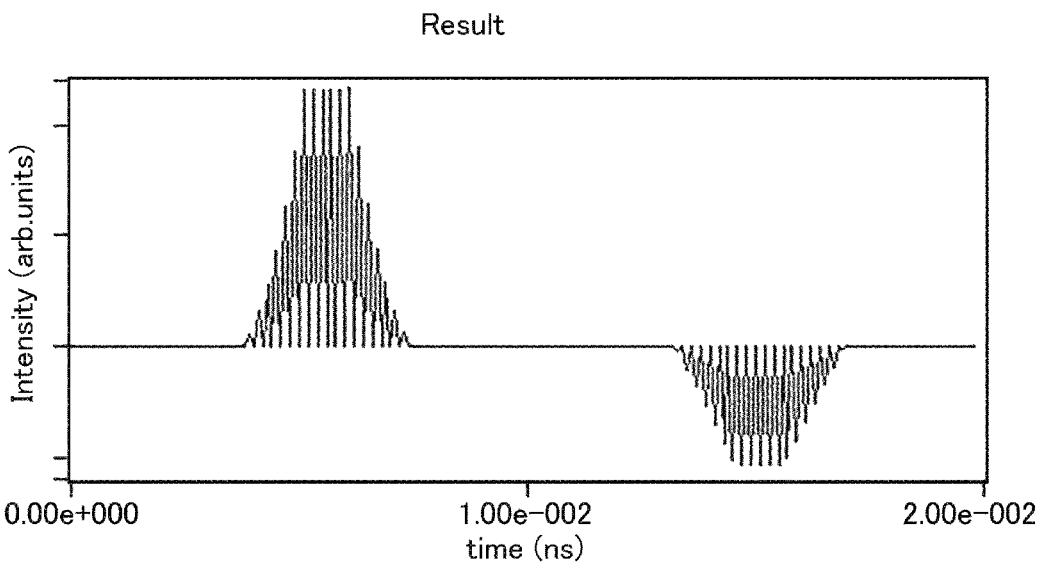
FIGS. 18A and 18B show magnetic resonance signals before and after the first improvement according to Example 4 is applied.
Figure 18B:
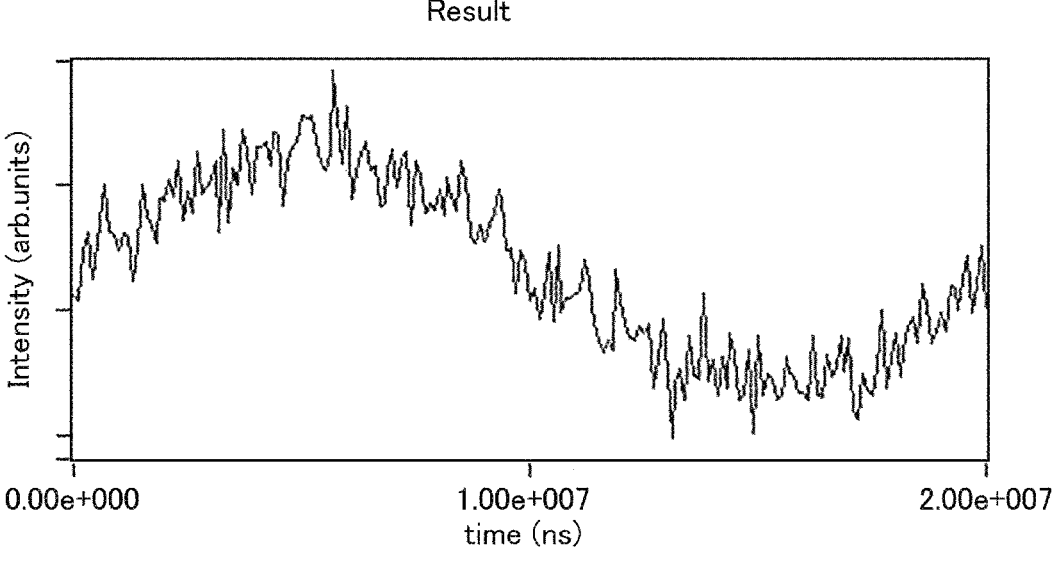

Whether performance was improved before and after making the first improvement was verified. FIGS. 18A and 18B show magnetic resonance signals before and after the first improvement. FIG. 18A is the magnetic resonance signal before the first improvement, and FIG. 18B is the magnetic resonance signal after the first improvement. From the comparison of the magnetic resonance signals shown in FIGS. 18B and 18B, it was verified that the signal of the physical field could be read accurately without any shift in the period of the pulse sequence.

Figure 19:
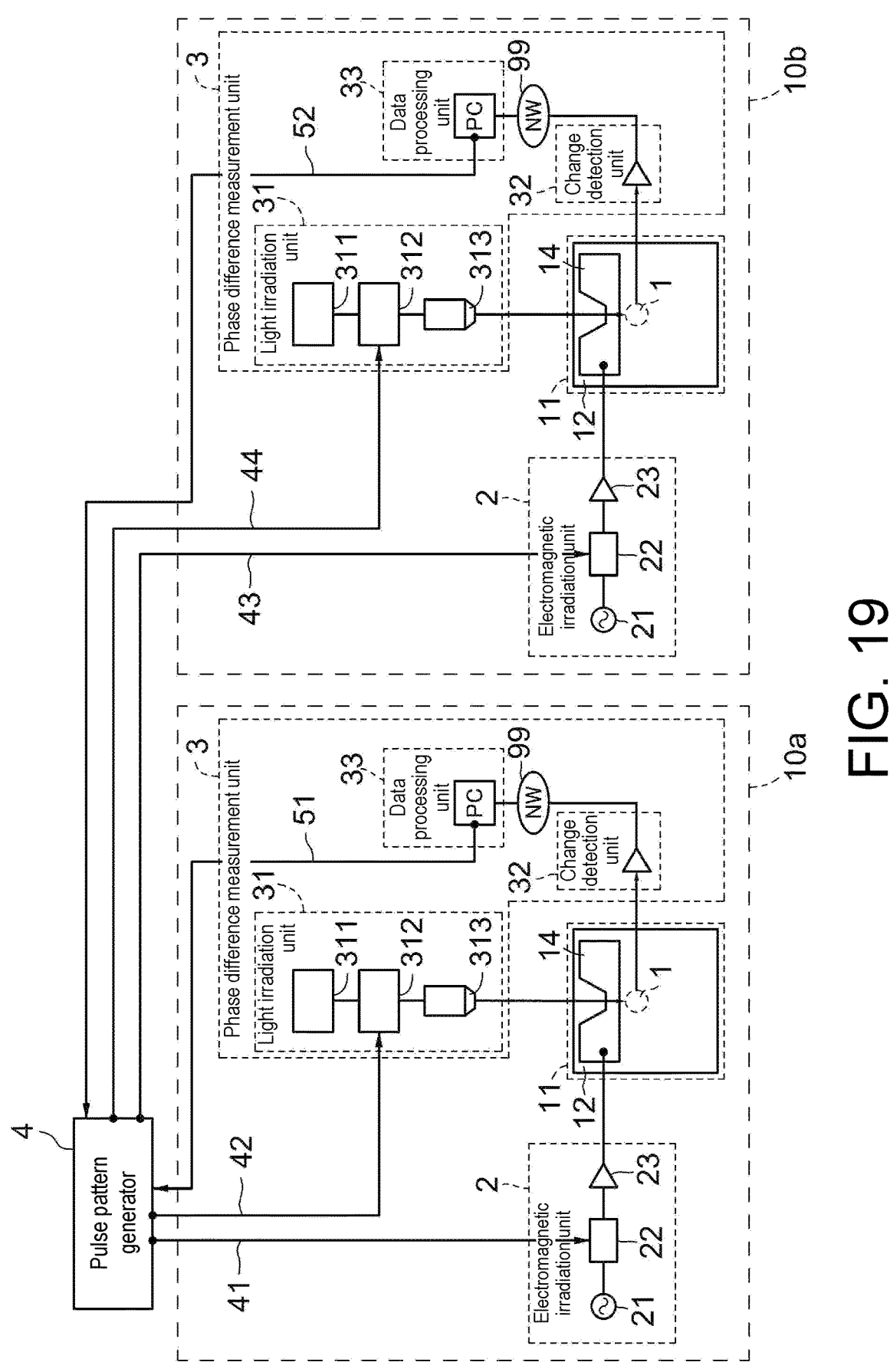
FIG. 19 is a diagram for describing the concept of the second improvement according to Example 4, which is a figure showing the first connection mode when applying a trigger signal in multiple phase difference measurement devices.
Figure 20:
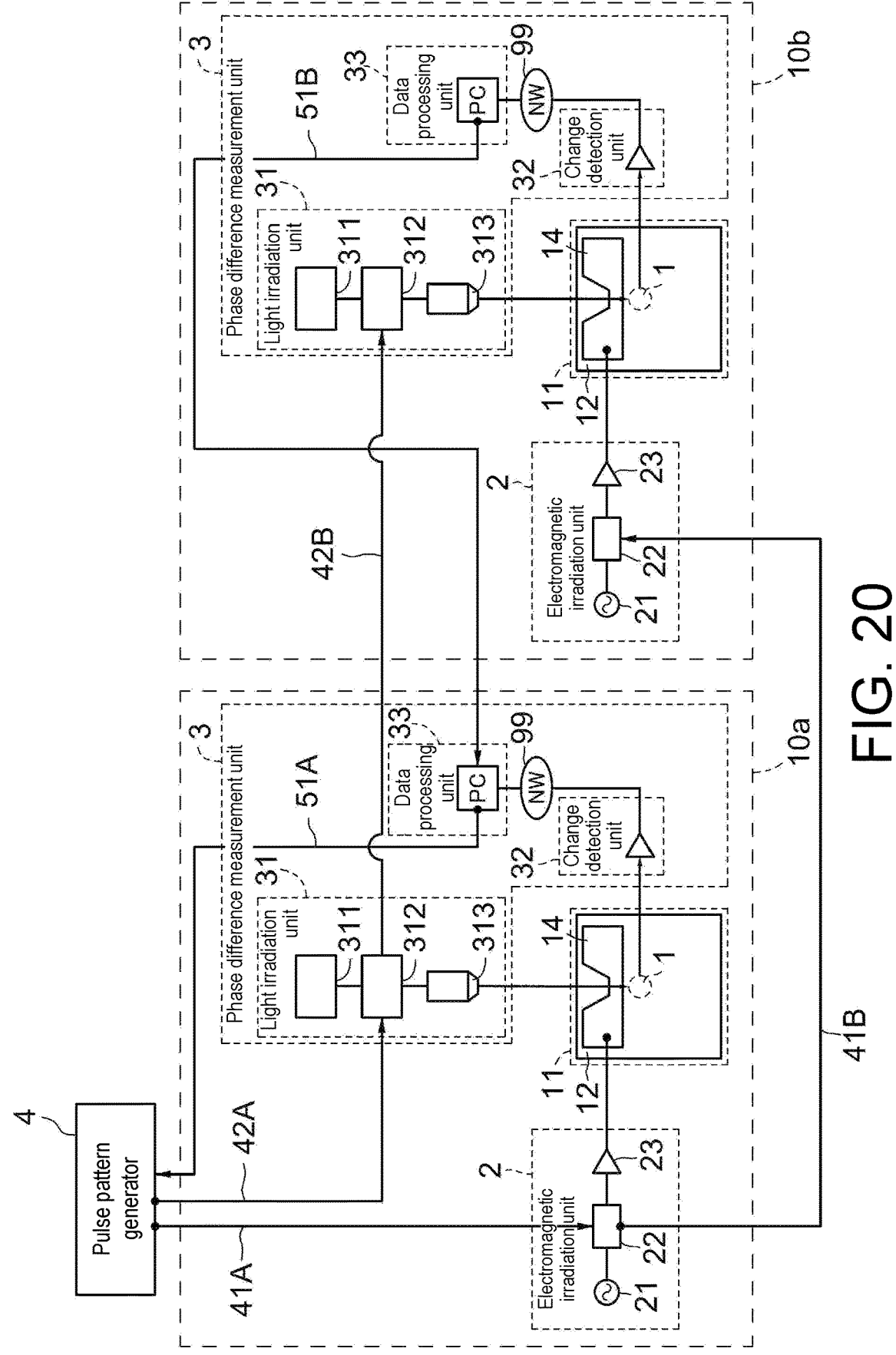
FIG. 20 is a diagram for describing the concept of the second improvement according to Example 4, which is a figure showing the second connection mode when applying a trigger signal in multiple phase difference measurement devices.

FIGS. 19 and 20 are diagrams for describing the concept of the second improvement according to Example 4, and are diagrams showing connection modes when applying a trigger signal in multiple phase difference measurement devices. FIG. 19 shows a first connection mode, and FIG. 20 shows a second connection mode.

As shown in FIGS. 19 and 20, the pulse pattern generator 4 was connected in order to realize the pulse sequences illustrated in FIGS. 6 and 8 etc. in the entire multiple phase difference measurement devices 10a and 10b. The pulse pattern generator 4 outputs a pulse signal for operation timing to each of units (the switch 22 and the acoustic optical modulator 312) of the phase difference measurement devices, and the phase difference measurement devices 10a and 10b are operated synchronously. A trigger signal set in the data processing unit 33 (PC) is input to the pulse pattern generator 4, and time information is fed back from the data processing unit 33 to the pulse pattern generator 4. In the example, for the same object 9 (in the example shown in the embodiment, electrical equipment 9), a magnetic field (first physical field) was measured using the phase difference measurement device 10a shown on the left side of the figure, and an electric field (second physical field) was measured using the phase difference measurement device 10b shown on the right side of the figure.

In the first connection mode shown in FIG. 19, a pulse signal for operation timing was input from the pulse pattern generator 4 to each of the units of the measurement devices 10a and 10b in parallel through signal lines 41, 42, 43 and 44. Similarly, a trigger signal was input to the pulse pattern generator 4 in parallel from the data processing unit 33 of each of the measurement devices 10a and 10b through signal lines 51 and 52.

In the second connection mode shown in FIG. 20, pulse signals for operation timing were input in series from the pulse pattern generator 4 to each of the units of the measurement devices 10a and 10b through serially connected signal lines 41A and 41B and serially connected signal lines 42A and 42B. Similarly, trigger signals were input to the pulse pattern generator 4 in series from the data processing unit 33 of each of the measurement devices 10a and 10b through serially connected signal lines 51A and 51B.

Figure 21A:
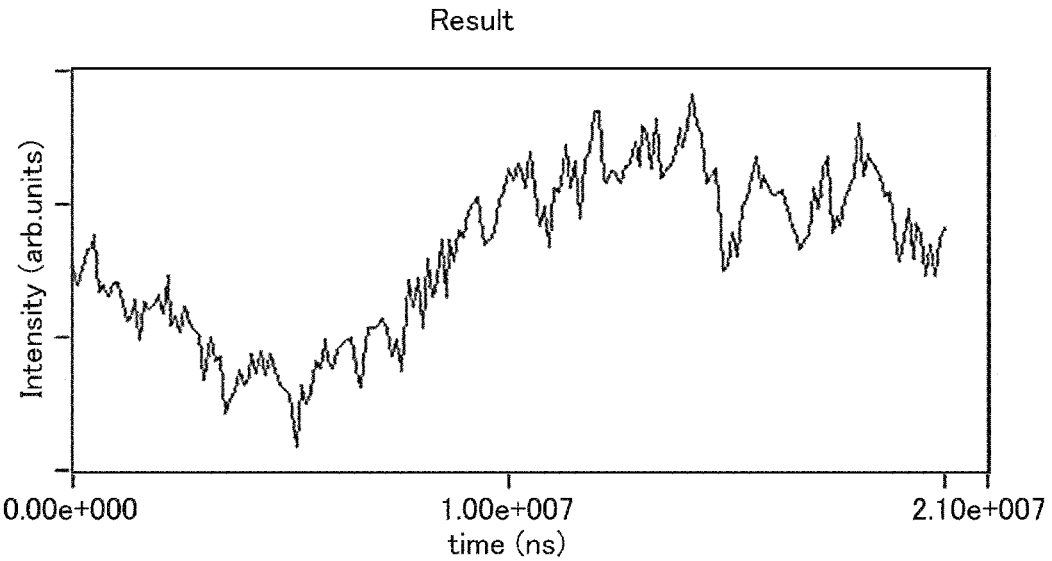
FIGS. 21A and 21B show magnetic resonance signals obtained by the first connection mode shown in FIG. 19.
Figure 21B:
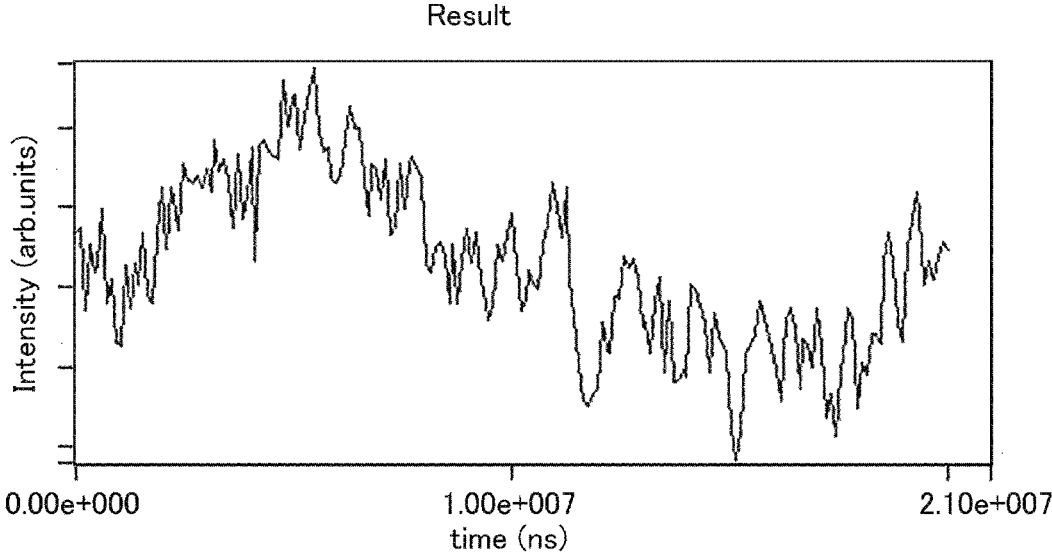
Figure 22A:
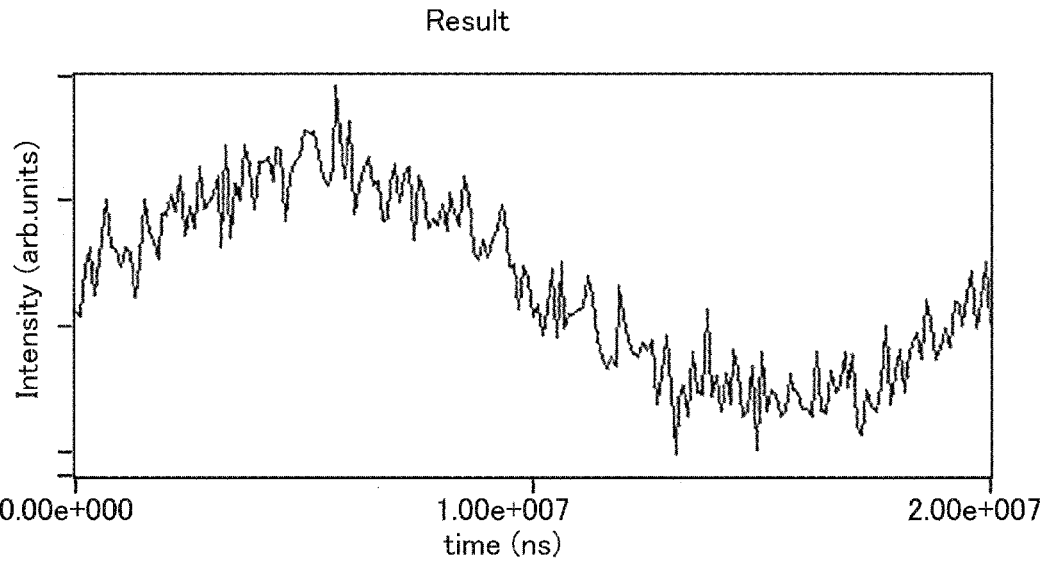
FIGS. 22A and 22B show magnetic resonance signals obtained by the second connection mode shown in FIG. 20.
Figure 22B:
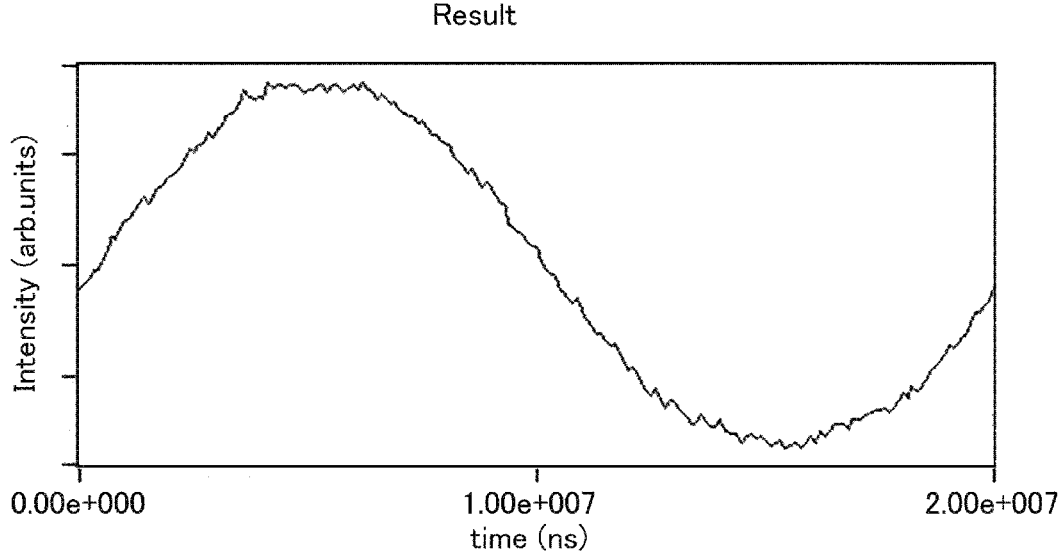

The performance improvement due to the second improvement was compared between the first connection mode and the second connection mode. FIGS. 21A and 21B show magnetic resonance signals obtained by the first connection mode shown in FIG. 19. FIG. 21A is the magnetic resonance signal obtained by the phase difference measurement device 10a shown on the left side of FIG. 19, FIG. 21B is the magnetic resonance signal obtained by the phase difference measurement device 10b shown on the right side of FIG. 19. FIGS. 22A and 22B show magnetic resonance signals obtained by the second connection mode shown in FIG. 20. FIG. 22A is the magnetic resonance signal obtained by the phase difference measurement device 10a shown on the left side of FIG. 20, FIG. 22B is the magnetic resonance signal obtained by the phase difference measurement device 10b shown on the right side of FIG. 20. For ease of comparison, the scales of the horizontal axes of the graphs in (A) and (B) FIGS. 21A and 21B and FIGS. 22A and 22B are the same.

As shown in FIGS. 21A and 21B, according to the first connection mode, each time measurement was performed, a shift in the phase (peak position) of the magnetic resonance signals occurred between the phase difference measurement devices 10a and 10b. On the other hand, as shown in FIGS. 22A and 22B, according to the second connection mode, the phase shift of the magnetic resonance signals was reduced and almost eliminated compared to the first connection mode, and the magnetic resonance signals were constantly acquired with the same phase between the phase difference measurement devices 10a and 10b. As a result, comparing the second connection mode shown in FIG. 20, in which pulse signals for operation timing were input in series to each of the units of the phase difference measurement devices 10a and 10b, with the first connection mode shown in FIG. 19, in which pulse signals for operation timing were input in parallel to each of the units of the phase difference measurement devices 10a and 10b, it was verified that the phase shift of the magnetic resonance signal obtained by measurement was reduced, and the performance of the second connection mode was improved compared to the first connection mode.

The embodiments disclosed in the description are illustrative in all respects, and should not be considered restrictive. The technical scope of the present invention is not limited to the embodiments exemplified above, for example, when measuring the phase by a combination of measuring the magnetic field (current) with a continuous wave (CW) and measuring the electric field (voltage) with a pulse sequence, such a way is within the technical scope of the present invention.

What is claimed is:

1. A phase difference measurement device, comprising:
an electromagnetic irradiation unit, repeatedly irradiating
  a quantum sensor element with electromagnetic waves
  for manipulating an electron spin state of the quantum
  sensor element which changes via interaction with a
  first physical field or a second physical field generated
  by an alternating current (AC) signal; and
a phase difference measurement unit, acquiring a plurality
  of the electron spin states after the interaction with the
  first physical field or the second physical field, and measuring a phase difference between a plurality of physical fields based on the plurality of the electron spin states acquired, wherein the phase difference measurement unit comprises a first physical field phase calculation unit that calculates a phase of the first physical field based on the plurality of the electron spin states after the interaction with the first physical field, and a second physical field phase calculation unit that calculates a phase of the second physical field based on the plurality of the electron spin states after the interaction with the second physical field, and measures the phase difference based on the phase of the first physical field calculated and the phase of the second physical field calculated.

2. The phase difference measurement device according to claim 1, wherein the first physical field phase calculation unit calculates the phase of the first physical field by fitting a plurality of time-series data corresponding to the plurality of the electron spin states after the interaction with the first physical field, and the second physical field phase calculation unit calculates the phase of the second physical field by fitting a plurality of time-series data corresponding to the plurality of the electron spin states after the interaction with the second physical field.

3. The phase difference measurement device according to claim 1, wherein the electromagnetic irradiation unit is a pulse sequence for observing a free induction decay (FID) signal of the electron spin state, and repeatedly irradiates the quantum sensor element with the electromagnetic waves in a pulse sequence comprising a plurality of π/2 pulses.

4. The phase difference measurement device according to claim 2, wherein the electromagnetic irradiation unit is a pulse sequence for observing a spin echo signal of the electron spin state, and repeatedly irradiates the quantum sensor element with the electromagnetic waves in a pulse sequence comprising a plurality of π/2 pulses and π pulses between the plurality of π/2 pulses, and each of the first physical field phase calculation unit and the second physical field phase calculation unit fits the plurality of time-series data corresponding to curvature of the AC signal.

5. The phase difference measurement device according to claim 1, wherein the phase difference measurement unit further comprises a light irradiation unit that irradiates the quantum sensor element with light for reading phase information of the electron spin state after the interaction with the first physical field or the second physical field, a change detection unit that detects a change that occurs in the quantum sensor element due to irradiation of the light, and a data processing unit that reads phase information of the electron spin state from the change detected and measures the phase difference between the phase of the first physical field and the phase of the second physical field based on the phase information of the electron spin state that is read.

6. The phase difference measurement device according to claim 5, further comprising:

a pulse pattern generator, outputting a pulse signal for operation timing to the electromagnetic irradiation unit and the light irradiation unit using a fluorescence intensity when initializing the electron spin state as a trigger, and correcting a deviation in a measurement cycle.

7. The phase difference measurement device according to claim 6, wherein the pulse signal for operation timing is connected in series between a plurality of the phase difference measurement devices.

8. The phase difference measurement device according to claim 1, wherein the AC signal is an AC signal passing through electrical equipment.

9. A phase difference measurement method, comprising:

irradiating repeatedly a quantum sensor element with electromagnetic waves for manipulating an electron spin state of the quantum sensor element which changes via interaction with a first physical field or a second physical field generated by an alternating current (AC) signal; and acquiring a plurality of the electron spin states after the interaction with the first physical field or the second physical field, and measuring a phase difference between a phase of the first physical field and a phase of the second physical field based on the plurality of the electron spin states acquired, wherein measuring the phase difference comprises calculating the phase of the first physical field based on the plurality of the electron spin states after the interaction with the first physical field, and calculating the phase of the second physical field based on the plurality of the electron spin states after the interaction with the second physical field, and measuring the phase difference based on the phase of the first physical field calculated and the phase of the second physical field calculated.

10. The phase difference measurement method according to claim 9, wherein when calculating the phase of the first physical field, the phase of the first physical field is calculated by fitting a plurality of time-series data corresponding to the plurality of the electron spin states after the interaction with the first physical field, and when calculating the phase of the second physical field, the phase of the second physical field is calculated by fitting a plurality of time-series data corresponding to the plurality of the electron spin states after the interaction with the second physical field.

11. Electrical equipment, comprising the phase difference measurement device according to claim 1.

* * * * *